US012568744B2

(12) United States Patent
Zheng et al.

(10) Patent No.: US 12,568,744 B2
(45) Date of Patent: Mar. 3, 2026

(54) DISPLAY SUBSTRATE AND MANUFACTURING METHOD THEREFOR, AND DISPLAY APPARATUS

(71) Applicant: BOE Technology Group Co., Ltd., Beijing (CN)

(72) Inventors: Can Zheng, Beijing (CN); Li Wang, Beijing (CN); Hao Zhang, Beijing (CN); Yipeng Chen, Beijing (CN); Ke Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/938,307

(22) Filed: Nov. 6, 2024

(65) Prior Publication Data

US 2025/0063912 A1 Feb. 20, 2025

Related U.S. Application Data

(63) Continuation of application No. 17/763,198, filed as application No. PCT/CN2021/097380 on May 31, 2021, now Pat. No. 12,167,653.

(30) Foreign Application Priority Data

Sep. 28, 2020 (CN) .......................... 202011041915.9

(51) Int. Cl.
| | |
|---|---|
| *H10K 59/131* | (2023.01) |
| *G09G 3/3233* | (2016.01) |
| *G09G 3/3266* | (2016.01) |
| *G09G 3/3291* | (2016.01) |

(Continued)

(52) U.S. Cl.
CPC ......... *H10K 59/131* (2023.02); *G09G 3/3233* (2013.01); *G09G 3/3266* (2013.01); *G09G 3/3291* (2013.01); *H10K 59/1213* (2023.02); *H10K 59/1216* (2023.02); *G09G 2300/0852* (2013.01); *G09G 2310/0278* (2013.01); *G09G 2310/061* (2013.01); *G09G 2320/0233* (2013.01); *H10K 59/1201* (2023.02)

(58) Field of Classification Search
CPC ............. H10K 59/131; H10K 59/1213; H10K 59/1216; G09G 3/3233; G09G 3/3291; G09G 3/3266
See application file for complete search history.

(56) References Cited

U.S. PATENT DOCUMENTS

2011/0025659 A1* 2/2011 Kwak .................. G09G 3/3233
345/80

* cited by examiner

*Primary Examiner* — Sardis F Azongha
(74) *Attorney, Agent, or Firm* — Ling Wu; Stephen Yang; Ling and Yang Intellectual Property

(57) ABSTRACT

A display substrate and a manufacturing method therefor, and a display apparatus. The display substrate includes a base substrate, a second power line, a data signal line and a plurality of sub-pixels, wherein at least one sub-pixel includes a pixel driving circuit and a light emitting device connected to the pixel driving circuit; a semiconductor layer and a plurality of conducting layers, which are disposed at one side of the semiconductor layer away from the base substrate, are disposed on the base substrate, a first electrode is arranged in at least one conducting layer, the first electrode is connected to the second power line, and there is an overlapping area between an orthographic projection of the first electrode on the base substrate and an orthographic projection of the data signal line on the base substrate.

17 Claims, 10 Drawing Sheets

(51) Int. Cl.
    *H10K 59/121*        (2023.01)
    *H10K 59/12*         (2023.01)

DISPLAY SUBSTRATE AND MANUFACTURING METHOD THEREFOR, AND DISPLAY APPARATUS

CROSS-REFERENCE TO RELATED APPLICATION(S)

This application a continuation application of the U.S. application Ser. No. 17/763,198, which is a national stage of PCT Application No. PCT/CN2021/097380, which is filed on May 31, 2021 and claims priority to Chinese Patent Application No. 202011041915.9 entitled "Pixel Circuit, Pixel Driving Method, Display Panel and Display Apparatus" and filed on Sep. 28, 2020. The above-identified applications are incorporated into this application by reference in their entireties.

TECHNICAL FIELD

The present disclosure relates to the field of display technology, and particularly, to a display substrate and a manufacturing method therefor, and a display apparatus.

BACKGROUND

An Organic Light Emitting Diode (OLED) is an active light emitting display device, which has the advantages of auto-luminescence, wide angle of view, high contrast, low power consumption, extremely high response speed, lightness and thinness, bendability, low cost, etc. With the continuous development of display technology, Flexible Displays that use OLEDs as light emitting devices and use Thin Film Transistors (TFTs) for signal control have become mainstream products in the field of display at present.

SUMMARY

The following is a summary about the subject matter described herein in detail. The summary is not intended to limit the protection scope of the claims.

The present disclosure provides a display substrate, including a base substrate, a second power line, a data signal line and a plurality of sub-pixels, wherein at least one sub-pixel includes a pixel driving circuit and a light emitting device connected to the pixel driving circuit, the pixel driving circuit is connected to the data signal line and the light emitting device is connected to the second power line; a semiconductor layer and a plurality of conducting layers, which are arranged at one side of the semiconductor layer away from the base substrate, are arranged on the base substrate, a first electrode is arranged in at least one conducting layer, the first electrode is connected to the second power line, and there is an overlapping area between an orthographic projection of the first electrode on the base substrate and an orthographic projection of the data signal line on the base substrate.

In an exemplary implementation, the first electrode includes a first electrode segment extending along a first direction and a second electrode segment extending along a second direction, there is an overlapping area between an orthographic projection of the second electrode segment on the base substrate and the orthographic projection of the data signal line on the base substrate, one end of the first electrode segment is connected to the second electrode segment, and the other end of the first electrode segment is connected to the second power line; and the second direction is an extension direction of the data signal line, and the first direction intersects the second direction.

In an exemplary implementation, the plurality of conducting layers includes a first conducting layer, a second conducting layer, a third conducting layer and a fourth conducting layer arranged sequentially at one side of the semiconductor layer away from the base substrate, the data signal line is arranged in the fourth conducing layer, and the first electrode is arranged in the first conducting layer, the second conducting layer or the third conducting layer.

In an exemplary implementation, the second power line is arranged in the fourth conducting layer, and the second power line is connected to the first electrode through a via hole.

In an exemplary implementation, the fourth conducting layer further includes a second power connecting line having one end connected to the second power line and the other end connected to the first electrode through a via hole.

In an exemplary implementation, the first electrode is arranged in the first conducting layer or the second conducting layer, an interlayer connecting electrode is further arranged in the third conducting layer, the interlayer connecting electrode is connected to the first electrode through a via hole, and the second power line is connected to the interlayer connecting electrode through a via hole.

In an exemplary implementation, the pixel driving circuit at least includes a first transistor, a second transistor, a third transistor, a fourth transistor and a fifth transistor; a first pole of the first transistor is connected to the data signal line, and a second pole of the first transistor is connected to a second node; a first pole of the second transistor is connected to a first node, and a second pole of the second transistor is connected to a third node; a gate electrode of the third transistor is connected to the first node, a first pole of the third transistor is connected to the first power line, and a second pole of the third transistor is connected to the third node; a first pole of the fourth transistor is connected to an initial signal line; and a first pole of the fifth transistor is connected to a reference signal line, and a second pole of the fifth transistor is connected to the second node.

In an exemplary implementation, the pixel driving circuit further includes a storage capacitor and a threshold capacitor, the storage capacitor includes a storage capacitor first polar plate and a storage capacitor second polar plate, and the threshold capacitor includes a threshold capacitor first polar plate and a threshold capacitor second polar plate; the storage capacitor second polar plate is connected to the first power line, and the storage capacitor first polar plate is connected to the first node; and the threshold capacitor second polar plate is connected to the second node, and the threshold capacitor first polar plate is connected to the first node.

In an exemplary implementation, the storage capacitor first polar plate and the threshold capacitor first polar plate are arranged in the first conducting layer, the storage capacitor first polar plate and the threshold capacitor first polar plate are connected to each other to form an integrated structure, and the threshold capacitor first polar plate does not overlap with the semiconductor layer.

In an exemplary implementation, the storage capacitor second polar plate and the threshold capacitor second polar plate are arranged in the second conducting layer, the storage capacitor second polar plate and the threshold capacitor second polar plate are spaced apart from each other, a storage capacitor second polar plate of a sub-pixel and a storage capacitor second polar plate of an adjacent sub-pixel are connected to each other to form an integrated structure, there is an overlapping area between an orthographic projection of the storage capacitor second polar plate on the base substrate and an orthographic projection of the storage capacitor first polar plate on the base substrate, and there is an overlapping area between an orthographic projection of the threshold capacitor second polar plate on the base substrate and an orthographic projection of the threshold capacitor first polar plate on the base substrate.

In an exemplary implementation, the fourth transistor is a double-gate transistor, and at least includes a fourth active layer arranged in the semiconductor layer and two fourth gate electrodes; and the display substrate further includes a first sub-polar plate, and there is an overlapping area between an orthographic projection of the first sub-polar plate on the base substrate and an orthographic projection of the fourth active layer, located between the two fourth gate electrodes, on the base substrate.

In an exemplary implementation, the two fourth gate electrodes are arranged in the first conducting layer, the first sub-polar plate is arranged in the second conducting layer, and the first sub-polar plate is connected to the initial signal line.

In an exemplary implementation, the fifth transistor is a double-gate transistor, and at least includes a fifth active layer arranged in the semiconductor layer and two fifth gate electrodes; and the display substrate further includes a second sub-polar plate, and there is an overlapping area between an orthographic projection of the second sub-polar plate on the base substrate and an orthographic projection of the fifth active layer, located between the two fifth gate electrodes, on the base substrate.

In an exemplary implementation, the two fifth gate electrodes are arranged in the first conducting layer, the second sub-polar plate is arranged in the second conducting layer, and the second sub-polar plate is connected to the first power line through a via hole.

In an exemplary implementation, the first transistor is a double-gate transistor, and at least includes a first active layer arranged in the semiconductor layer and two first gate electrodes; and the display substrate further includes a third sub-polar plate, and there is an overlapping area between an orthographic projection of the third sub-polar plate on the base substrate and an orthographic projection of the first active layer, located between the two first gate electrodes, on the base substrate.

In an exemplary implementation, the two first gate electrodes are arranged in the first conducting layer, the third sub-polar plate is arranged in the second conducting layer, and the third sub-polar plate is connected to the first power line through a via hole.

In an exemplary implementation, the second transistor is a double-gate transistor, and at least includes a second active layer arranged in the semiconductor layer and two second gate electrodes; and the display substrate further includes a fourth sub-polar plate, and there is an overlapping area between an orthographic projection of the fourth sub-polar plate on the base substrate and an orthographic projection of the second active layer, located between the two second gate electrodes, on the base substrate.

In an exemplary implementation, the two second gate electrodes are arranged in the first conducting layer, the third sub-polar plate is arranged in the second conducting layer, and the fourth sub-polar plate is connected to the first power line through a via hole.

The present disclosure further provides a display apparatus, including the aforementioned display substrate.

The present disclosure further provides a method for manufacturing a display substrate, the display substrate including a base substrate, a second power line, a data signal line and a plurality of sub-pixels, wherein at least one sub-pixel includes a pixel driving circuit and a light emitting device connected to the pixel driving circuit, the pixel driving circuit is connected to the data signal line and the light emitting device is connected to the second power line; the method including:

forming a semiconductor layer and a plurality of conducting layers, which are arranged at one side of the semiconductor layer away from the base substrate, on the base substrate, wherein a first electrode is arranged in at least one conducting layer, the first electrode is connected to the second power line, and there is an overlapping area between an orthographic projection of the first electrode on the base substrate and an orthographic projection of the data signal line on the base substrate.

In an exemplary implementation, the forming a semiconductor layer and a plurality of conducting layers, which are arranged at one side of the semiconductor layer away from the base substrate, on the base substrate includes:

forming a semiconductor layer on the base substrate; and forming sequentially a first conducting layer, a second conducting layer, a third conducting layer and a fourth conducting layer on the semiconductor layer, wherein the first electrode is arranged in the first conducting layer, the second conducting layer or the third conducting layer, the second power line and the data signal line are arranged in the fourth conducting layer, and the second power line is connected to the first electrode through a via hole.

Other aspects will become apparent upon reading and understanding accompanying drawings and the detailed description.

BRIEF DESCRIPTION OF THE DRAWINGS

Accompanying drawings are used for providing an understanding of technical solutions of the present application and form a part of the specification, are used for explaining the technical solutions of the present application together with embodiments of the present application, and do not constitute a limitation on the technical solutions of the present application.

DESCRIPTION OF REFERENCE SIGNS

Figure 1:
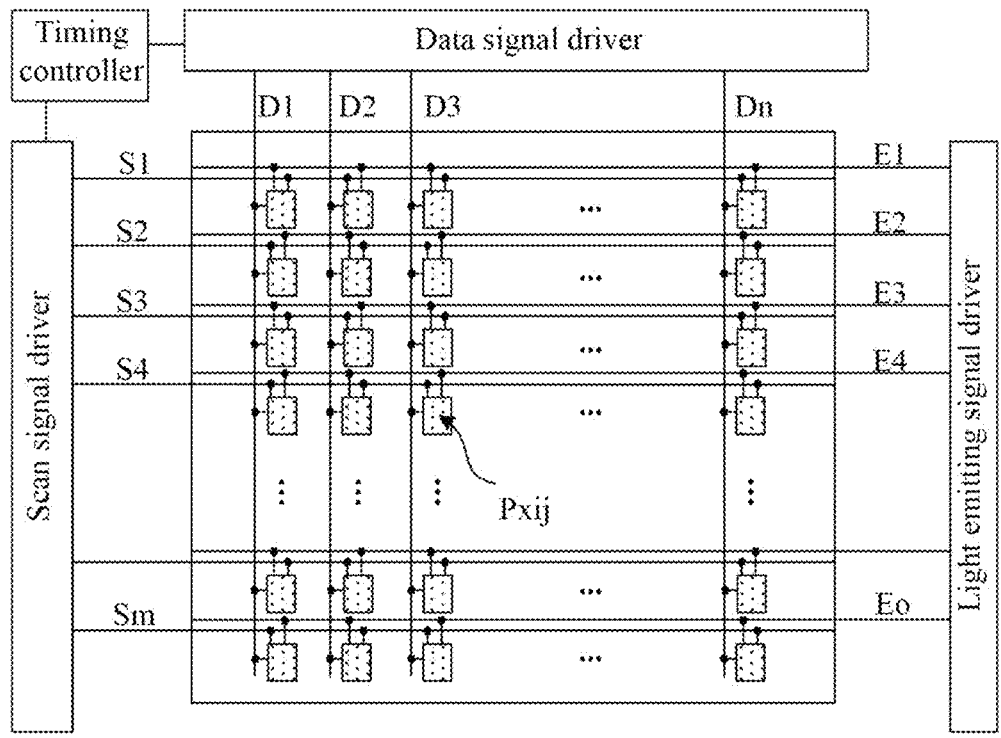
FIG. 1 is a schematic diagram of a structure of a display apparatus.

11—first active layer; 12—second active layer; 13—third active layer; 14—fourth active layer; 15—fifth active layer; 16—sixth active layer; 17—seventh active layer; 18—eighth active layer; 21—first scan signal line; 22—second scan signal line; 23—third scan signal line; 24—first light emitting control line; 25—second light emitting control line; 26—storage capacitor first polar plate; 27—threshold capacitor first polar plate; 28—first electrode; 31—initial signal line; 32—first connecting line; 33—storage capacitor second polar plate; 34—threshold capacitor second polar plate; 35—first sub-polar plate; 36—second sub-polar plate; 37—third sub-polar plate; 38—fourth sub-polar plate; 41—first connecting electrode; 42—second connecting electrode; 43—third connecting electrode; 44—fourth connecting electrode; 45—fifth connecting electrode; 46—sixth connecting electrode; 47—seventh connecting electrode; 48—eighth connecting electrode; 49—interlayer connecting electrode; 51—anode connecting electrode; 71—first power line; 72—reference signal line; 73—second power line; 74—data signal line; 75—second power connecting line; 101—base substrate; 102—driving circuit layer; 103—light emitting device; 104—encapsulation layer; 301—anode; 302—pixel definition layer; 303—organic light emitting layer; 304—cathode; 401—first encapsulation layer; 402—second encapsulation layer; and 403—third encapsulation layer.

DETAILED DESCRIPTION

In order to make the objects, technical solutions and advantages of the present disclosure more clear, the embodiments of the present disclosure will be described in detail below in combination with the drawings. It is to be noted that their implementations may be carried out in many different forms. Those of ordinary skill in the art may easily understand such a fact that manners and contents may be transformed into various forms without departing from the purpose and scope of the present disclosure. Therefore, the present disclosure should not be explained as being limited to the contents recorded in the following implementations only. The embodiments in the present disclosure and features in the embodiments may be arbitrarily combined with each other without conflicts.

Scales of the drawings in the present disclosure may be used as references in the actual processes, which, however, are not limited thereto. For example, a width to length ratio of a channel, a thickness of each film layer and a spacing between two film layers, and a width of each signal line and a spacing between two signal lines may be adjusted according to actual needs. The number of pixels in the display substrate and the number of sub-pixels in each pixel are not limited to the number shown in the drawings. The drawings described in the present disclosure are schematic structure diagrams only, and one implementation of the present disclosure is not limited to the shapes, numerical values or the like shown in the drawings.

Ordinal numerals such as "first", "second", "third" and the like in the specification are set to avoid confusion of the constituent elements, but not to set a limit in quantity.

In the specification, for convenience, words and sentences indicating orientations or positional relationships, such as "center", "upper", "lower", "front", "back", "vertical", "horizontal", "top", "bottom", "inside" and "outside", are used for describing positional relationships of constituent elements with reference to the accompanying drawings, and are merely for facilitating describing the specification and simplifying the description, rather than indicating or implying that referred apparatuses or elements must have particular orientations, and be constructed and operated in particular orientations. Thus, they should not be construed as a limitation to the present disclosure. The positional relationships of the constituent elements appropriately change according to directions of describing the constituent elements. Therefore, the words and sentences are not limited to those described in the specification, but may be replaced appropriately according to a situation.

In the specification, unless otherwise specified and defined explicitly, the terms "install", "connect" and "link" should be broadly understood. For example, it may be a fixed connection, a detachable connection, or an integral connection; may be a mechanical connection or an electrical connection; and may be a direct connection, or an indirect connection through an intermediary, or an internal connection between two elements. Those of ordinary skill in the art may understand the meanings of the above terms in the present disclosure according to specific situations.

In the specification, a transistor refers to an element which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region and the source electrode. It is to be noted that in the specification, the channel region refers to a region which the current mainly flows through.

In the specification, a first pole may be a drain electrode and a second pole may be a source electrode; or, a first pole may be a source electrode and a second pole may be a drain electrode. In the case that transistors with opposite polarities are used, or that a direction of a current changes during operation of a circuit, or the like, functions of the "source electrode" and the "drain electrode" are sometimes exchanged. Therefore, the "source electrode" and the "drain electrode" may be exchanged in the specification.

In the specification, an "electrical connection" includes a case in which constituent elements are connected together through an element with a certain electric action. There is no specific restriction on the "element with a certain electric action" as long as it allows transmission and receiving of electric signals between connected constituent elements. Examples of the "element with a certain electric action" include not only an electrode and a wiring, but also a switching element such as a transistor, a resistor, an inductor, a capacitor, other elements with various functions, etc.

In the specification, "parallel" refers to a state in which an angle formed by two straight lines is −10° or more and 10° or less, and thus also includes a state in which the angle is-5° or more and 5° or less. In addition, "perpendicular" refers to a state in which an angle formed by two straight lines is 80° or more and 100° or less, and thus also includes a state in which the angle is 85° or more and 95° or less.

In the specification, "film" and "layer" are interchangeable. For example, sometimes a "conducting layer" may be replaced with a "conducting film". Similarly, sometimes an "insulating film" may be replaced with an "insulating layer".

"About" in the present disclosure means that a boundary is not defined so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver and a pixel array. The timing controller is connected to the data driver, the scan driver and the light emitting driver respectively, the data driver is connected to a plurality of data signal lines (D1 to Dn) respectively, the scan driver is connected to a plurality of scan signal lines (S1 to Sm) respectively, and the light emitting driver is connected to a plurality of light emitting signal lines (E1 to Eo) respectively. The pixel array may include a plurality of sub-pixels Pxij, i and j may be natural numbers, at least one sub-pixel Pxij may include a circuit unit and a light emitting device connected to the circuit unit, and the circuit unit may include at least one scan signal line, at least one data signal line, at least one light emitting signal line and a pixel driving circuit. In an exemplary implementation, the timing controller may provide a gray value and a control signal, which are suitable for the specification of the data driver, to the data driver; provide a clock signal, a scan start signal, etc., which are suitable for the specification of the scan driver, to the scan driver; and provide a clock signal, a transmit stop signal, etc., which are suitable for the specification of the light emitting driver, to the light emitting driver. The data driver may generate a data voltage to be provided to the data lines D1, D2, D3, . . . , and Dn, by using the gray value and the control signal received from the timing controller. For example, the data driver may sample the gray value using the clock signal and apply a data voltage corresponding to the gray value to the data signal lines D1 to Dn by taking a pixel row as a unit, wherein n may be a natural number. The scan driver may generate a scan signal to be provided to the scan signal lines S1, S2, S3, . . . , and Sm, by receiving the clock signal, the scan start signal, etc. from the timing controller. For example, the scan driver may provide sequentially a scan signal with a turn-on level pulse to the scan signal lines S1 to Sm. For example, the scan driver may be constructed in a form of a shift register and may generate a scan signal in such a manner as to transmit sequentially the scan start signal provided in a form of a turn-on level pulse to a next-stage circuit under the control of the clock signal, wherein m may be a natural number. The light emitting driver may generate a transmit signal to be provided to the light emitting signal lines E1, E2, E3, . . . , and Eo, by receiving the clock signal, the transmit stop signal, etc. from the timing controller. For example, the light emitting driver may provide sequentially a transmit signal with a turn-off level pulse to the light emitting signal lines E1 to Eo. For example, the light emitting driver may be constructed in a form of a shift register and may generate a transmit signal in such a manner as to transmit sequentially the transmit stop signal provided in a form of a turn-off level pulse to a next-stage circuit under the control of the clock signal, wherein o may be a natural number.

Figure 2:
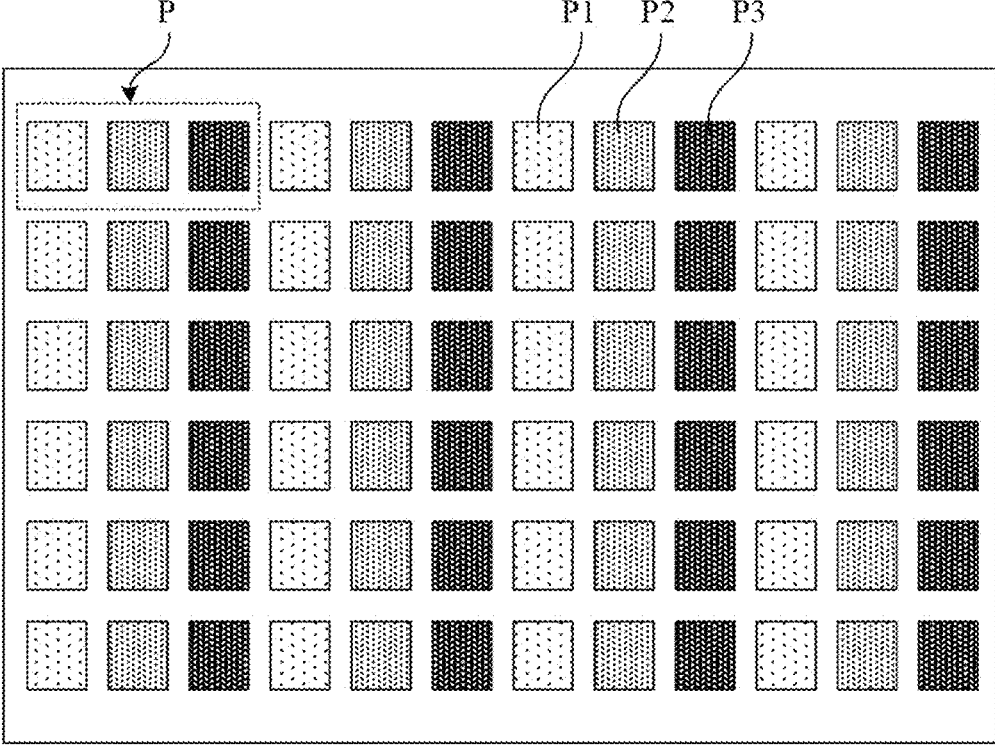
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix, at least one of the plurality of pixel units P includes a first sub-pixel P1 emitting light of a first color, a second sub-pixel P2 emitting light of a second color and a third sub-pixel P3 emitting light of a third color, and the first sub-pixel P1, the second sub-pixel P2, and the third sub-pixel P3 each include a pixel driving circuit and a light emitting device. The pixel driving circuit in the first sub-pixel P1, the second sub-pixel P2 and the third sub-pixel P3 is connected to a scan signal line, a data signal line and a light emitting signal line respectively. The pixel driving circuit is configured to receive a data voltage transmitted by the data signal line under the control of the scan signal line and the light emitting signal line, and output a corresponding current to the light emitting device. The light emitting device in the first sub-pixel P1, the second sub-pixel P2 and the third sub-pixel P3 is connected to the pixel driving circuit of the sub-pixel where the light emitting device is located, and is configured to emit light with a corresponding luminance in response to a current output by the pixel driving circuit of the sub-pixel where the light emitting device is located.

In an exemplary implementation, the pixel unit P may include a red (R) sub-pixel, a green (G) sub-pixel and a blue (B) sub-pixel, or may include a red sub-pixel, a green sub-pixel, a blue sub-pixel and a white (W) sub-pixel, which is not limited in the present disclosure. In an exemplary implementation, the shape of the sub-pixel in the pixel unit may be a rectangle, a rhombus, a pentagon or a hexagon. When the pixel unit includes three sub-pixels, the three sub-pixels may be arranged side by side horizontally, side by side vertically, or in the form of "hu"; and when the pixel unit includes four sub-pixels, the four sub-pixels may be arranged side by side horizontally, side by side vertically, or in the shape of a square, which is not limited in the present disclosure.

Figure 3:
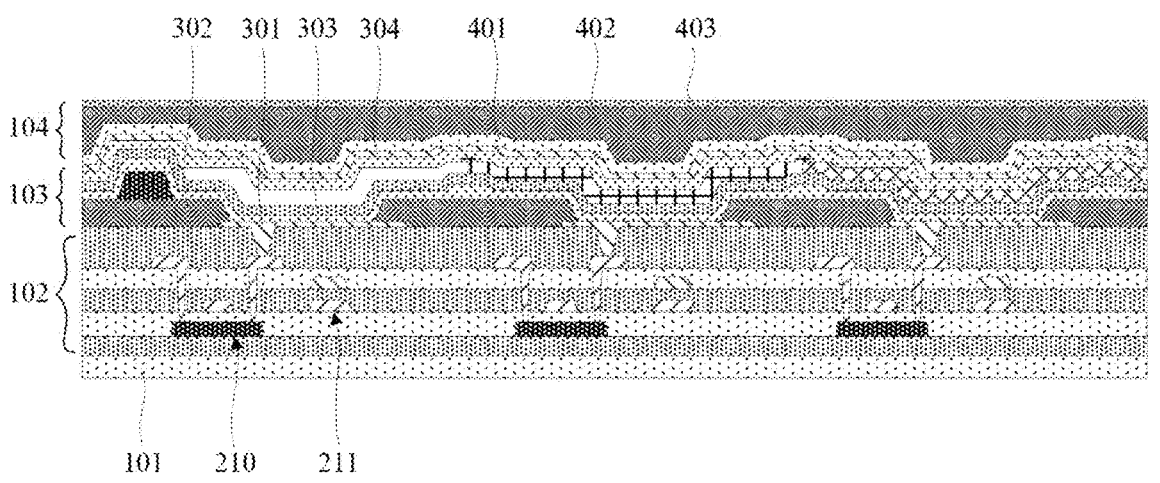
FIG. 3 is a schematic diagram of a sectional structure of a display substrate.

FIG. 3 is a schematic diagram of a sectional structure of a display substrate, which illustrates a structure of three sub-pixels of an OLED display substrate. As shown in FIG. 3, in a plane perpendicular to the display substrate, the display substrate may include a driving circuit layer 102 arranged on a base substrate 101, a light emitting device 103 arranged at one side of the driving circuit layer 102 away from the base substrate 101, and an encapsulation layer 104 arranged at one side of the light emitting device 103 away from the base substrate 101. In some possible implementations, the display substrate may include other film layers, such as a photo spacer, which is not limited in the present disclosure herein.

In an exemplary implementation, the driving circuit layer 102 of each sub-pixel may include a plurality of transistors and a storage capacitor constituting a pixel driving circuit. FIG. 3 illustrates an example in which each sub-pixel includes one driving transistor and one storage capacitor. In some possible implementations, the driving circuit layer 102 of each sub-pixel may include: a first insulating layer arranged on the base substrate; an active layer arranged on the first insulating layer; a second insulating layer overlying the active layer; a gate electrode and a first polar plate arranged on the second insulating layer; a third insulating layer overlying the gate electrode and the first polar plate; a second polar plate arranged on the third insulating layer; a fourth insulating layer overlying the second polar plate, the second, third and fourth insulating layers being provided with a via hole exposing the active layer; a source electrode and a drain electrode arranged on the fourth insulating layer, the source electrode and the drain electrode being connected respectively to the active layer through the via hole; and a planarization layer overlying the aforementioned structures, the planarization layer being provided with a via hole exposing the drain electrode. The active layer, the gate electrode, the source electrode and the drain electrode form a driving transistor 210, and the first polar plate and the second polar plate form a storage capacitor 211.

In an exemplary implementation, the light emitting device 103 may include an anode 301, a pixel definition layer 302, an organic light emitting layer 303 and a cathode 304. The anode 301 is arranged on the planarization layer, and is connected to the drain electrode of the driving transistor 210 through the via hole provided in the planarization layer; the pixel definition layer 302 is arranged on the anode 301 and the planarization layer, and is provided with a pixel opening exposing the anode 301; the organic light emitting layer 303 is at least partially arranged in the pixel opening, and is connected to the anode 301; the cathode 304 is arranged on the organic light emitting layer 303, and is connected to the organic light emitting layer 303; and the organic light emitting layer 303 emits light of a corresponding color under the driving of the anode 301 and the cathode 304.

In an exemplary implementation, the encapsulation layer 104 may include a first encapsulation layer 401, a second encapsulation layer 402 and a third encapsulation layer 403 that are stacked. The first encapsulation layer 401 and the third encapsulation layer 403 may be made of an inorganic material, and the second encapsulation layer 402 may be made of an organic material, and the second encapsulation layer 402 is arranged between the first encapsulation layer 401 and the third encapsulation layer 403, which may ensure that external water vapor cannot enter the light emitting device 103.

In an exemplary implementation, the organic light emitting layer 303 may include a hole injection layer (HIL), a hole transport layer (HTL), an electron block layer (EBL), a light emitting layer (EML), a hole block layer (HBL), an electron transport layer (ETL) and an electron injection layer (EIL) that are stacked. In an exemplary implementation, the hole injection layers and the electron injection layers of all the sub-pixels may be connected together as a common layer, the hole transport layers and the electron transport layers of all the sub-pixels may be connected together as a common layer, the hole block layers of all the sub-pixels may be connected together as a common layer, and the light emitting layers and the electron block layers of adjacent sub-pixels may be slightly overlapped with each other, or may be isolated from each other.

Figure 4:
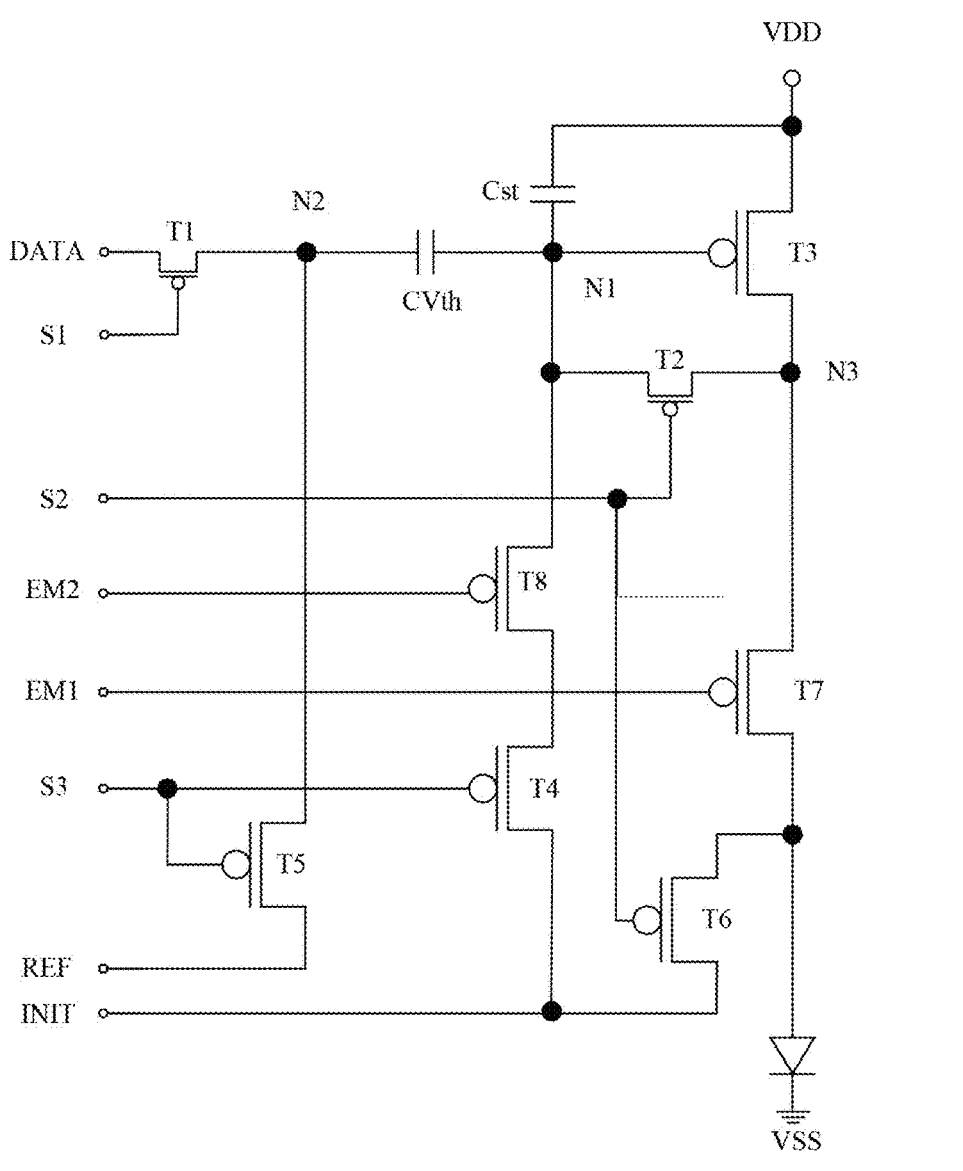
FIG. 4 is a schematic diagram of an equivalent circuit of a pixel driving circuit.

In an exemplary implementation, the pixel driving circuit may be of a 3T1C, 4T1C, 5T1C, 5T2C, 6T1C, 7T1C or 8T2C structure. FIG. 4 is a schematic diagram of an equivalent circuit of a pixel driving circuit, which illustrates an 8T2C structure. As shown in FIG. 4, the pixel driving circuit may include eight transistors (a first transistor T1 to an eighth transistor T8) and two capacitors (a storage capacitor Cst and a threshold capacitor CVth), and the pixel driving circuit is connected to 10 signal lines including a first scan signal line S1, a second scan signal line S2, a third scan signal line S3, a first light emitting signal line EM1, a second light emitting signal line EM2, a reference signal line REF, an initial signal line INIT, a data signal line DATA, a first power line VDD and a second power line VSS.

In an exemplary implementation, a gate electrode of the first transistor T1 is connected to the first scan signal line S1, a first pole of the first transistor T1 is connected to the data signal line DATA, and a second pole of the first transistor T1 is connected to a second node N2. A gate electrode of the second transistor T2 is connected to the second scan signal line S2, a first pole of the second transistor T2 is connected to a first node N1, and a second pole of the second transistor T2 is connected to a third node N3. A gate electrode of the third transistor T3 is connected to the first node N1, a first pole of the third transistor T3 is connected to the first power line VDD, and a second pole of the third transistor T3 is connected to the third node N3. A gate electrode of the fourth transistor T4 is connected to the third scan signal line S3, a first pole of the fourth transistor T4 is connected to the initial signal line INIT, and a second pole of the fourth transistor T4 is connected to a first pole of the eighth transistor T8. A gate electrode of the fifth transistor T5 is connected to the third scan signal line S3, a first pole of the fifth transistor T5 is connected to the reference signal line REF, and a second pole of the fifth transistor T5 is connected to the second node N2. A gate electrode of the sixth transistor T6 is connected to the second scan signal line S2, a first pole of the sixth transistor T6 is connected to the initial signal line INIT, and a second pole of the sixth transistor T6 is connected to a first pole of the light emitting device. A gate electrode of the seventh transistor T7 is connected to the first light emitting signal line EM1, a first pole of the seventh transistor T7 is connected to the third node N3, and a second pole of the seventh transistor T7 is connected to the first pole of the light emitting device. A gate electrode of the eighth transistor T8 is connected to the second light emitting signal line EM2, the first pole of the eighth transistor T8 is connected to the second pole of the fourth transistor T4, and a second pole of the eighth transistor T8 is connected to the first node N1. A first end of the storage capacitor Cst is connected to the first power line VDD, and a second end of the storage capacitor Cst is connected to the first node N1. A first end of the threshold capacitor CVth is connected to the second node N2, and a second end of the threshold capacitor CVth is connected to the first node N1.

In an exemplary implementation, the first transistor T1 to the eighth transistor T8 may be P-type transistors or N-type transistors. Using the same type of transistors in the pixel driving circuit may simplify the process flow, reduce the process difficulty of a display panel, and improve the product yield. In some possible implementations, the first transistor T1 to the eighth transistor T8 may include P-type transistors and N-type transistors.

In an exemplary implementation, the second pole of the light emitting device is connected to the second power line VSS, a signal of the second power line VSS is a low-level signal and a signal of the first power line VDD is a continuously provided high-level signal.

In an exemplary implementation, the second scan signal line S2 is a scan signal line in the pixel driving circuit of the present display row, and the third scan signal line S3 is a scan signal line in the pixel driving circuit of the previous display row, that is, for the nth display row, the second scan signal line S2 is S(n) and the third scan signal line S3 is S(n−1), the third scan signal line S3 of the present display row may be the same signal line as the second scan signal line S2 in the pixel driving circuit of the previous display row, or the second scan signal line S2 of the present display row may be the same signal line as the third scan signal line S3 in the pixel driving circuit of the next display row, so as to reduce the signal lines of the display panel and realize the narrow bezel of the display panel.

In an exemplary implementation, the first light emitting signal line EM1 is a light emitting signal line in the pixel driving circuit of the present display row, and the second light emitting signal line EM2 is a light emitting signal line in the pixel driving circuit of the next display row, that is, for the nth display row, the first light emitting signal line EM1 is EM(n) and the second light emitting signal line EM2 is EM(n+1), and the first light emitting signal line EM1 of the present display row may be the same signal line as the first light emitting signal line EM1 in the pixel driving circuit of the next display row, so as to reduce the signal lines of the display panel and realize the narrow bezel of the display panel.

In an exemplary implementation, the first scan signal line S1, the second scan signal line S2, the third scan signal line S3, the first light emitting signal line EM1, the second light emitting signal line EM2 and the initial signal line INIT may extend along a horizontal direction, and the data signal line DATA, the first power line VDD, the second power line VSS and the reference signal line REF may extend along a vertical direction.

In an exemplary implementation, the light emitting device may be an organic light emitting device (OLED), and includes a first pole (anode), an organic light emitting layer, and a second pole (cathode) that are stacked.

Figures 5, 6:
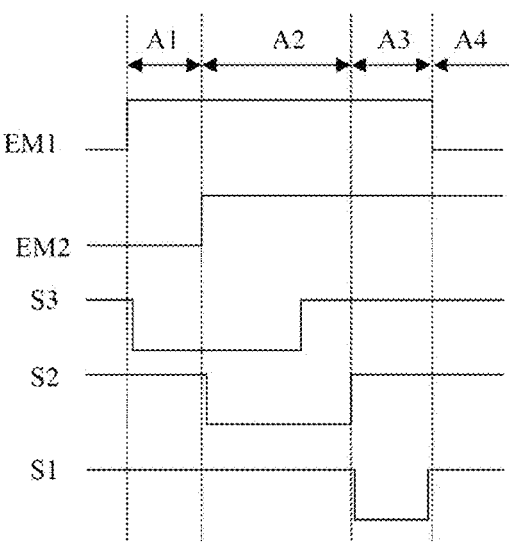
FIG. 5 is a working timing diagram of a pixel driving circuit.
FIG. 6 is a schematic diagram of a structure of a display substrate in accordance with an exemplary embodiment of the present disclosure.

FIG. 5 is a working timing diagram of a pixel driving circuit. An exemplary embodiment of the present disclosure will be described below through a working process of the pixel driving circuit shown in FIG. 4. The pixel driving circuit in FIG. 4 includes eight transistors (the first transistor T1 to the eighth transistor T8), two capacitors (the storage capacitor Cst and the threshold capacitor CVth) and 10 signal lines (the first scan signal line S1, the second scan signal line S2, the third scan signal line S3, the first light emitting signal line EM1, the second light emitting signal line EM2, the reference signal line REF, the initial signal line INIT, the data signal line DATA, the first power line VDD and the second power line VSS). All the eight transistors are P-type transistors.

In an exemplary implementation, the working process of the pixel driving circuit may include the following stages.

In a first stage A1, which is referred to as a reset stage, the signals of the second light emitting signal line EM2 and the third scan signal line S3 are low-level signals, and the signals of the first scan signal line S1, the second scan signal line S2 and the first light emitting signal line EM1 are high-level signals. The signal of the third scan signal line S3 is a low-level signal, which causes the fourth transistor T4 and the fifth transistor T5 to be turned on, and a reference signal of the reference signal line REF is provided to the second node N2 which is reset to a reference voltage Vref of the reference signal. The signal of the second light emitting signal line EM2 is a low-level signal, which causes the eighth transistor T8 to be turned on, and as the fourth transistor T4 and the eighth transistor T8 are turned on, an initial signal of the initial signal line INIT is provided to the first node N1 which is reset to an initial voltage Vinit of the initial signal. In this stage, the first transistor T1, the second transistor T2, the third transistor T3, the sixth transistor T6 and the seventh transistor T7 are turned off, and the OLED does not emit light in this stage.

In a second stage A2, which is referred to as a threshold acquisition stage, the signals of the second scan signal line S2 and the third scan signal line S3 are low-level signals, and the signals of the first scan signal line S1, the first light emitting signal line EM1 and the second light emitting signal line EM2 are high-level signals. The signal of the second scan signal line S2 is a low-level signals, which causes the second transistor T2 and the sixth transistor T6 to be turned on. The second transistor T2 is turned on, such that potentials of the first node N1 and the third node N3 are the same, and the third transistor T3 forms a "diode connected" structure. The first power line VDD charges the first node N1, and the first node N1 is charged until it reaches a potential of Vdd−|Vth|. Information carrying a threshold voltage of the third transistor T3 is stored in the storage capacitor Cst. Vdd is a supply voltage of the first power line VDD, and Vth is a threshold voltage of the third transistor T3. The sixth transistor T6 is turned on, such that an initial voltage of the initial signal line INIT is provided to a first pole of the OLED to initialize (reset) the first pole of the OLED and clear its internal pre-stored voltage. The signal of the third scan signal line S3 is a low-level signal, and the fifth transistor T5 keeps being turned on, so that the second node N2 maintains the reference voltage Vref of the reference signal. In this stage, the first transistor T1, the third transistor T3, the seventh transistor T7 and the eighth transistor T8 are turned off, and the OLED does not emit light in this stage.

In a third stage A3, which is referred to as a data writing stage, the signal of the first scan signal line S1 is a low-level signal, and the signals of the second scan signal line S2, the third scan signal line S3, the first light emitting signal line EM1 and the second light emitting signal line EM2 are high-level signals. The signal of the first scan signal line S1 is a low-level signal, which causes the first transistor T1 to be turned on. The data signal line DATA outputs a data voltage to the second node N2, and the second node N2 writes the data voltage Vdt. After the signals of the first node N1 and the second node N2 are superimposed, the potential of the first node N1 becomes:

$$V_{N1}=Vdd-|Vth|+(Vdt-Vref)*Cvth/(Cvth+Cst).$$

In a fourth stage A4, which is referred to as a light emitting stage, the signal of the first light emitting signal line EM1 is a low-level signal, and the signals of the first scan signal line S1, the second scan signal line S2, the third scan signal line S3 and the second light emitting signal line EM2 are high-level signals. The signal of the first light emitting signal line EM1 is a low-level signal, which causes the seventh transistor T7 to be turned on. The potential of the first node N1 causes the third transistor T3 to be turned on. The supply voltage output by the first power line VDD provides a driving voltage to the first pole of the OLED through the third transistor T3 and the seventh transistor T7 which are turned on, to drive the OLED to emit light. In this stage, the first node N1 and the second node N2 are suspended, and their original potentials are maintained by means of the storage capacitor Cst. In a driving process of the pixel driving circuit, a driving current flowing through the third transistor T3 (driving transistor) is determined by a voltage difference between its gate electrode and first pole. Therefore, according to the potential of the first node N1, the driving current flowing through the third transistor T3 is:

$$I=\beta*[(Vdt-Vref)CVth/(Cvth+Cst)]^2,$$

wherein I is the driving current flowing through the third transistor T3, that is, a driving current which drives the OLED, B is a constant, Vdt is the data voltage output by the data signal line DATA, and Vref is the reference voltage output by the reference signal line REF. There is no information of the threshold voltage of the third transistor T3 in the formula of the driving current, so the pixel driving circuit has a self-compensation effect on the threshold voltage of the third transistor T3.

In the working process of the pixel driving circuit, in the reset stage, the potential of the first node N1 is the initial voltage Vinit, and the potential of the second node N2 is the reference voltage Vref. In the threshold acquisition stage, the potential of the first node N1 is Vdd−|Vth|, and the potential of the second node N2 is the reference voltage Vref. In the data writing stage, the potential of the first node N1 is $$V_{N1} = Vdd - |Vth| + (Vdt - Vref)*Cvth/(Cvth + Cst),$$

and the potential of the second node N2 is the data voltage Vdt. In the light emitting stage, the potential of the first node N1 is $V_{N1}$, and the potential of the second node N2 is the data voltage Vdt. A feature of the pixel driving circuit of an exemplary embodiment of the present disclosure is that the threshold acquisition stage and the data writing stage are separated in time, and the acquisition time of the threshold voltage Vth may be increased through timing control, so as to improve the compensation ability of the threshold voltage Vth of the pixel driving circuit.

FIG. 6 is a schematic diagram of a structure of a display substrate in accordance with an exemplary embodiment of the present disclosure, which illustrates a planar structure of three sub-pixels. As shown in FIG. 6, in a plane parallel to the display substrate, a first scan signal line 21, a second scan signal line 22, a third scan signal line 23, a first light emitting control line 24, a second light emitting control line 25, an initial signal line 31, a first power line 71, a reference signal line 72, a second power line 73, a data signal line 74, a pixel driving circuit and a light emitting device are provided in at least one sub-pixel. The pixel driving circuit may include a storage capacitor, a threshold capacitor and a plurality of transistors. Each of the transistors may include an active layer, a gate electrode, a first pole and a second pole; the storage capacitor includes a storage capacitor first polar plate 26 and a storage capacitor second polar plate 33; and the threshold capacitor includes a threshold capacitor first polar plate 27 and a threshold capacitor second polar plate 34. In an exemplary implementation, the pixel driving circuit is connected to the first power line 71 and the data signal line 74, respectively. The first power line 71 provides a high-level signal to the pixel driving circuit, the data signal line 74 provides a data signal to the pixel driving circuit, and the light emitting device is connected to the second power line 73 which provides a low-level signal to the light emitting device. In an exemplary implementation, the display substrate further includes a first electrode 28. The first electrode 28 is connected to the second power line 73, and there is an overlapping area between an orthographic projection of the first electrode 28 on the plane of the display substrate and an orthographic projection of the data signal line 74 on the plane of the display substrate.

In a plane perpendicular to the display substrate, the display substrate may include a semiconductor layer and a plurality of conducting layers arranged sequentially on a base substrate, and the first electrode 28 is arranged in at least one conducting layer. In an exemplary embodiment, the plurality of conducting layers may include a first conducting layer, a second conducting layer, a third conducting layer and a fourth conducting layer arranged sequentially on the semiconductor layer, the data signal line 74 may be arranged in the fourth conducting layer, and the first electrode 28 may be arranged in the first conducting layer or on the second conducting layer or on the third conducting layer.

In an exemplary embodiment, the semiconductor layer may include the active layers of the plurality of transistors, the first conducting layer may include the first scan signal line 21, the second scan signal line 22, the third scan signal line 23, the first light emitting control line 24, the second light emitting control line 25, the storage capacitor first polar plate 26 and the threshold capacitor first polar plate 27, the second conducting layer may include the initial signal line 31, the storage capacitor second polar plate 33 and the threshold capacitor second polar plate 34, the third conducting layer may include the first power line 71 and the reference signal line 72, and the fourth conducting layer may include the second power line 72 and the data signal line 74.

In an exemplary embodiment, the first scan signal line 21, the second scan signal line 22, the third scan signal line 23, the first light emitting control line 24 and the second light emitting control line 25 extend along a first direction X, and the storage capacitor first polar plate 26 and the threshold capacitor first polar plate 27 are connected to each other to form an integrated structure. The initial signal line 31 extends along the first direction X, and the storage capacitor second polar plate 33 and the threshold capacitor second polar plate 34 are spaced apart from each other. The first power line 71, the reference signal line 72, the second power line 73 and the data signal line 74 extend along a second direction Y. The first direction X may be an extending direction of the scan signal line, and the second direction Y may be an extending direction of the data signal line.

In an exemplary embodiment, the storage capacitor second polar plates 33 of adjacent sub-pixels in one sub-pixel row are connected to each other by a connecting line, and the storage capacitor second polar plates 33 connected to each other in one sub-pixel row also serve as first power connecting lines, so that all sub-pixels in one sub-pixel row have the same supply voltage, thereby improving display uniformity.

In an exemplary embodiment, the second conducting layer may include a first connecting line 32, which extends along the first direction X and is connected to the reference signal line 72, so that all sub-pixels in one sub-pixel row have the same reference voltage, thereby improving display uniformity.

In an exemplary embodiment, the pixel driving circuit may include the first transistor T1, the second transistor T2, the third transistor T3, the fourth transistor T4 and the fifth transistor T5. The first pole of the first transistor T1 is connected to the data signal line 74, and the second pole of the first transistor T1 is connected to the threshold capacitor second polar plate 34; the first pole of the second transistor T2 is connected to the storage capacitor first polar plate 26 and the threshold capacitor first polar plate 27, and the second pole of the second transistor T2 is connected to the second pole of the third transistor T3; the gate electrode of the third transistor T3 is connected to the storage capacitor first polar plate 26 and the threshold capacitor first polar plate 27, and the first pole of the third transistor T3 is connected to the first power line 71; the first pole of the fourth transistor T4 is connected to the initial signal line 31, and the second pole of the fourth transistor T4 is connected to the storage capacitor first polar plate 26 and the threshold capacitor first polar plate 27; and the first pole of the fifth transistor T5 is connected to the reference signal line 72, and the second pole of the fifth transistor T5 is connected to the threshold capacitor second polar plate 34.

In an exemplary embodiment, the first transistor T1, the second transistor T2, the fourth transistor T4 and the fifth transistor T5 are double-gate transistors. The second conducting layer may include a first sub-polar plate 35, a second sub-polar plate 36, a third sub-polar plate 37 and a fourth sub-polar plate 38. The first sub-polar plate 35 is configured to introduce parasitic capacitance at a double-gate intermediate node of the fourth transistor T4, the second sub-polar plate 36 is configured to introduce parasitic capacitance at a double-gate intermediate node of the fifth transistor T5, the third sub-polar plate 37 is configured to introduce parasitic capacitance at a double-gate intermediate node of the first transistor T1, and the fourth sub-polar plate 38 is configured to introduce parasitic capacitance at a double-gate intermediate node of the second transistor T2.

In an exemplary embodiment, the fourth transistor T4 at least includes a fourth active layer and two fourth gate electrodes, and there is an overlapping area between an orthographic projection of the first sub-polar plate 35 on the base substrate and an orthographic projection of the fourth active layer, located between the two fourth gate electrodes, on the base substrate. The two fourth gate electrodes are arranged in the first conducting layer, the first sub-polar plate 35 is arranged in the second conducting layer, and the first sub-polar plate 35 is connected to the initial signal line 31.

In an exemplary embodiment, the fifth transistor T5 at least includes a fifth active layer and two fifth gate electrodes, and there is an overlapping area between an orthographic projection of the second sub-polar plate 36 on the base substrate and an orthographic projection of the fifth active layer, located between the two fifth gate electrodes, on the base substrate. The two fifth gate electrodes are arranged in the first conducting layer, the second sub-polar plate 36 is arranged in the second conducting layer, and the second sub-polar plate 36 is connected to the first power line 71 through a via hole.

In an exemplary embodiment, the first transistor T1 at least includes a first active layer and two first gate electrodes, and there is an overlapping area between an orthographic projection of the third sub-polar plate 37 on the base substrate and an orthographic projection of the first active layer, located between the two first gate electrodes, on the base substrate. The two first gate electrodes are arranged in the first conducting layer, the third sub-polar plate 37 is arranged in the second conducting layer, and the third sub-polar plate 37 is connected to the first power line 71 through a via hole.

In an exemplary embodiment, the second transistor T3 at least includes a second active layer and two second gate electrodes, and there is an overlapping area between an orthographic projection of the fourth sub-polar plate 38 on the base substrate and an orthographic projection of the second active layer, located between the two second gate electrodes, on the base substrate. The two second gate electrodes are arranged in the first conducting layer, the fourth sub-polar plate 38 is arranged in the second conducting layer, and the fourth sub-polar plate 38 is connected to the first power line 71 through a via hole.

In an exemplary embodiment, the third conducting layer may include a first connecting electrode 41, a second connecting electrode 42, a third connecting electrode, a fourth connecting electrode 44, a fifth connecting electrode 45, a sixth connecting electrode 46, a seventh connecting electrode 47, an eighth connecting electrode and an interlayer connecting electrode 49. The first connecting electrode 41 serves as the first pole of the second transistor T2, the second connecting electrode 42 serves as the second pole of the eighth transistor T8, the third connecting electrode serves as the first pole of the first transistor T1, the fourth connecting electrode 44 also serves as the second pole of the first transistor T1 and the second pole of the fifth transistor T5, the fifth connecting electrode 45 also serves as the first pole of the fourth transistor T4 and the first pole of the sixth transistor T6, the sixth connecting electrode 46 also serves as the second pole of the fourth transistor T4 and the first pole of the eighth transistor T8, the seventh connecting electrode 47 also serves as the second pole of the second transistor T2, the second pole of the third transistor T3 and the first pole of the seventh transistor T7, the eighth connecting electrode also serves as the second pole of the sixth transistor T6 and the second pole of the seventh transistor T7, and the interlayer connecting electrode 49 is configured to connect the first electrode 28 with the second power line.

In an exemplary embodiment, the fourth conducting layer may include an anode connecting electrode 51 configured to connect the eighth connecting electrode with the anode of the light emitting device.

In an exemplary embodiment, the first electrode 28 may include a first electrode segment extending along the first direction X and a second electrode segment extending along the second direction Y, there is an overlapping area between an orthographic projection of the second electrode segment on the base substrate and an orthographic projection of the data signal line 74 on the base substrate, one end of the first electrode segment is connected to the second electrode segment, and the other end of the first electrode segment is connected to the second power line through a via hole.

In an exemplary embodiment, the third conducting layer may include a second power connecting line 75 having one end connected to the second power line 73 and the other end connected to the interlayer connecting electrode 49 through a via hole, and the interlayer connecting electrode 49 is connected to the first electrode 28 through a via hole.

In an exemplary implementation, the display substrate may include a first insulating layer, a second insulating layer, a third insulating layer, a fourth insulating layer and a fifth insulating layer. The first insulating layer is arranged between the base substrate and the semiconductor layer, the second insulating layer is arranged between the semiconductor layer and the first conducting layer, the third insulating layer is arranged between the first conducting layer and the second conducting layer, the fourth insulating layer is arranged between the second conducting layer and the third conducting layer, and the fifth insulating layer is arranged between the third conducting layer and the fourth conducting layer.

In the display substrate in accordance with an exemplary embodiment of the present disclosure, a first electrode is arranged, there is an overlapping area between an orthographic projection of the first electrode on the base substrate and an orthographic projection of the data signal line on the base substrate, and the first electrode is connected to the second power line, thus effectively avoiding the influence of jumps of the data voltage on the critical node, thereby preventing the jumps of the data voltage from affecting the potential of the critical node of the pixel driving circuit, and improving the display effect.

Exemplary description is made below through a process of manufacturing a display substrate. "Patterning process" mentioned in the present disclosure includes photoresist coating, mask exposure, development, etching, photoresist stripping, etc., for metal materials, inorganic materials or transparent conducting materials, and includes organic material coating, mask exposure, development, etc., for organic materials. Any one or more of sputtering, evaporation and chemical vapor deposition may be used for deposition, any one or more of spray coating, spin coating and inkjet printing may be used for coating, and any one or more of dry etching and wet etching may be used for etching, which are not limited in the present disclosure. A "thin film" refers to a layer of thin film manufactured with a certain material on a base substrate using deposition, coating or other processes. If the "thin film" does not need the patterning process in the entire manufacturing process, the "thin film" may also be called a "layer". If the "thin film" needs the patterning process in the entire manufacturing process, the "thin film" is called a "thin film" before the patterning process and is called a "layer" after the patterning process. The "layer" which has experienced the patterning process includes at least one "pattern". "A and B being arranged in the same layer" in the present disclosure means that A and B are formed simultaneously through a single patterning process, and the "thickness" of a film layer is the dimension of the film layer in a direction perpendicular to the display substrate. In an exemplary embodiment of the present disclosure, "an orthographic projection of B being located within the range of an orthographic projection of A" means that the boundary of the orthographic projection of B falls within the boundary range of the orthographic projection of A, or the boundary of the orthographic projection of A overlaps with the boundary of the orthographic projection of B. "An orthographic projection of A containing an orthographic projection of B" means that the boundary of the orthographic projection of B falls within the boundary range of the orthographic projection of A, or the boundary of the orthographic projection of A overlaps with the boundary of the orthographic projection of B.

In an exemplary implementation, taking the case of three sub-pixels in one sub-pixel row in the display substrate as an example, the process of manufacturing the display substrate may include the following operations.

Figure 7:
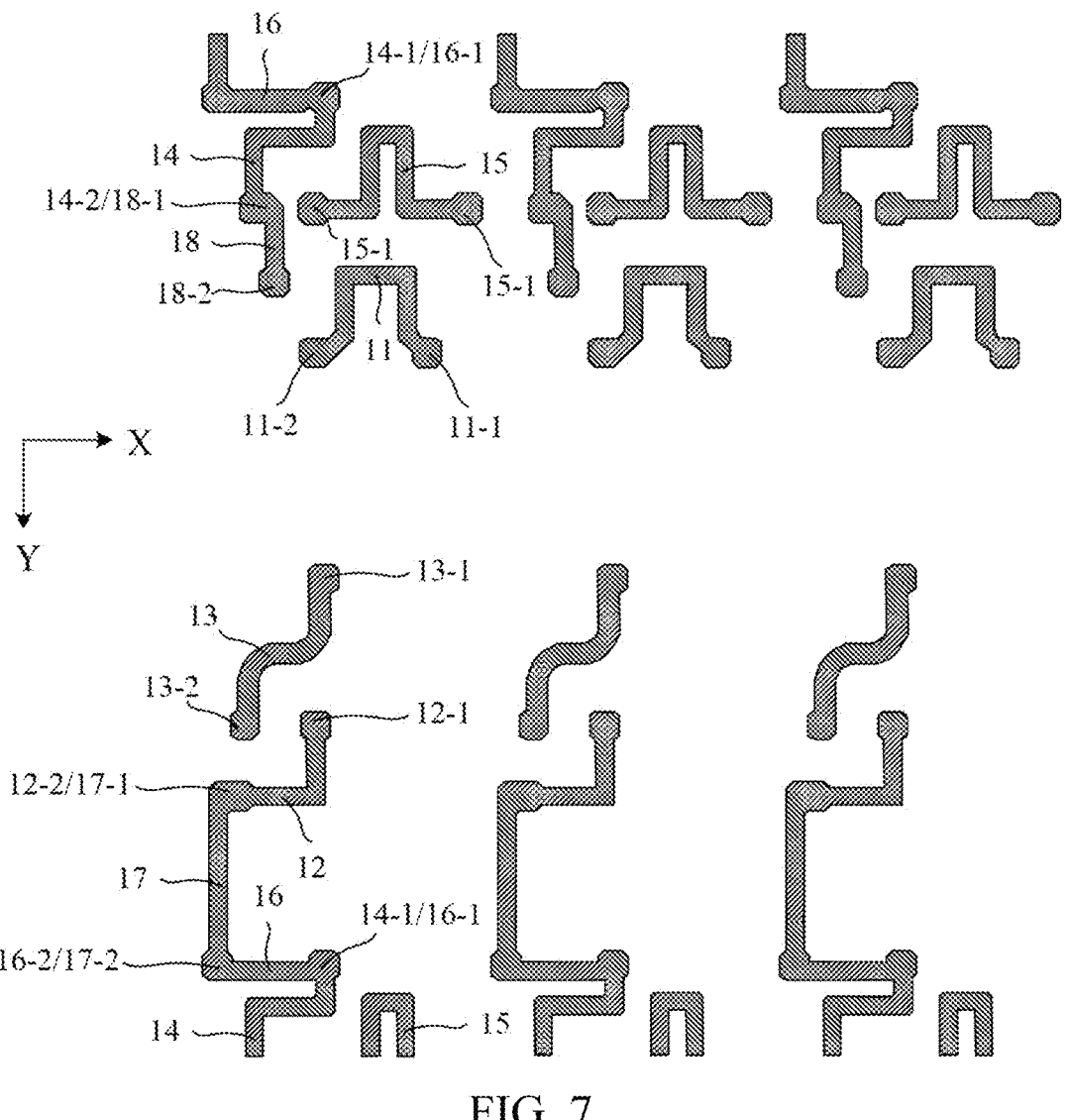
FIG. 7 is a schematic diagram after a pattern of a semiconductor layer is formed in accordance with an exemplary embodiment of the present disclosure.

(1) A pattern of a semiconductor layer is formed. In an exemplary embodiment, forming a pattern of a semiconductor layer may include: depositing sequentially a first insulating thin film and a semiconductor thin film on a base substrate, and patterning the semiconductor thin film through a patterning process to form a first insulating layer overlying the base substrate and a semiconductor layer arranged on the first insulating layer, as shown in FIG. 7.

In an exemplary embodiment, the semiconductor layer of at least one sub-pixel may include the first active layer of the first transistor T1 to the eighth active layer of the eighth transistor T8, the first active layer 11 of the first transistor T1, the third active layer 13 of the third transistor T3 and the fifth active layer 15 of the fifth transistor T5 are arranged separately, the second active layer 12 of the second transistor T2, the sixth active layer 16 of the sixth transistor T6 and the seventh active layer 17 of the seventh transistor T7 are connected to each other to form an integrated structure, the fourth active layer 14 of the fourth transistor T4 and the eighth active layer 18 of the eighth transistor T8 are connected to each other to form an integrated structure, the fourth active layer 14 of the present sub-pixel is connected to the sixth active layer 16 of the sub-pixel in the previous sub-pixel row, and the sixth active layer 16 of the present sub-pixel is connected to the fourth active layer 14 of the sub-pixel in the next sub-pixel row.

In an exemplary embodiment, the active layer of each transistor may include a first region, a second region, and a channel region located between the first region and the second region.

In an exemplary embodiment, the first active layer 11 is in the shape of " JL ", the two ends of " JL " are a first region 11-1 of the first active layer 11 and a second region 11-2 of the first active layer 11, respectively. The first region 11-1 of the first active layer 11 and the second region 11-2 of the first active layer 11 are arranged separately.

In an exemplary embodiment, the second active layer 12 is in the shape of "lying L", and the two ends of the "lying L" are a first region 12-1 of the second active layer 12 and a second region 12-2 of the second active layer 12, respectively. The first region 12-1 of the second active layer 12 is arranged separately, and the second region 12-2 of the second active layer 12 also serves as a first region 17-1 of the seventh active layer 17, i.e., the second region 12-2 of the second active layer 12 and the first region 17-1 of the seventh active layer 17 are connected to each other.

In an exemplary embodiment, the third active layer 13 is in the shape of a wavy line extending along the second direction Y, and the two ends of the wavy line are a first region 13-1 of the third active layer 13 and a second region 13-2 of the third active layer 13, respectively. The first region 13-1 of the third active layer 13 is close to the first active layer 11 and the second region 13-2 of the third active layer 13 is close to the second active layer 12.

In an exemplary embodiment, the fourth active layer 14 is in the shape of a bifold line extending along the second direction Y, and the two ends of the bifold line are a first region 14-1 of the fourth active layer 14 and a second region 14-2 of the fourth active layer 14, respectively. The first region 14-1 of the fourth active layer 14 also serves as a first region 16-1 of the sixth active layer 16 of the sub-pixel in the previous sub-pixel row, that is, the first region 14-1 of the fourth active layer 14 of the present sub-pixel and the first region 16-1 of the sixth active layer 16 of the sub-pixel in the previous sub-pixel row are connected to each other. The second region 14-2 of the fourth active layer 14 also serves as a first region 18-1 of the eighth active layer 18, that is, the second region 14-2 of the fourth active layer 14 and the first region 18-1 of the eighth active layer 18 are connected to each other.

In an exemplary embodiment, the fifth active layer 15 is in the shape of " JL ", and the two ends of " JL " are a first region 15-1 of the fifth active layer 15 and a second region 15-2 of the fifth active layer 15, respectively. The first region 15-1 of the fifth active layer 15 and the second region 15-2 of the fifth active layer 15 are arranged separately.

In an exemplary embodiment, the sixth active layer 16 is in the shape of " __ ", and the two ends of " __ " are the first region 16-1 of the sixth active layer 16 and a second region 16-2 of the sixth active layer 16, respectively. The first region 16-1 of the sixth active layer 16 also serves as the first region 14-1 of the fourth active layer 14 of the sub-pixel in the next sub-pixel row, that is, the first region 16-1 of the sixth active layer 16 of the present sub-pixel and the first region 14-1 of the fourth active layer 14 of the sub-pixel in the next sub-pixel row are connected to each other. The second region 16-2 of the sixth active layer 16 also serves as a second region 17-2 of the seventh active layer 17, i.e., the second region 16-2 of the sixth active layer 16 and the second region 17-2 of the seventh active layer 17 are connected to each other.

In an exemplary embodiment, the seventh active layer 17 is in the shape of "1", and the two ends of "1" are the first region 17-1 of the seventh active layer 17 and the second region 17-2 of the seventh active layer 17, respectively. The first region 17-1 of the seventh active layer 17 also serves as the second region 12-2 of the second active layer 12, and the second region 17-2 of the seventh active layer 17 also serves as the second region 16-2 of the sixth active layer 16.

In an exemplary embodiment, the eighth active layer 18 is in the shape of "1", and the two ends of "1" are the first region 18-1 of the eighth active layer 18 and a second region 18-2 of the eighth active layer 18, respectively. The first region 18-1 of the eighth active layer 18 also serves as the second region 14-2 of the fourth active layer 14, and the second region 18-2 of the eighth active layer 18 is arranged separately.

Figure 8:
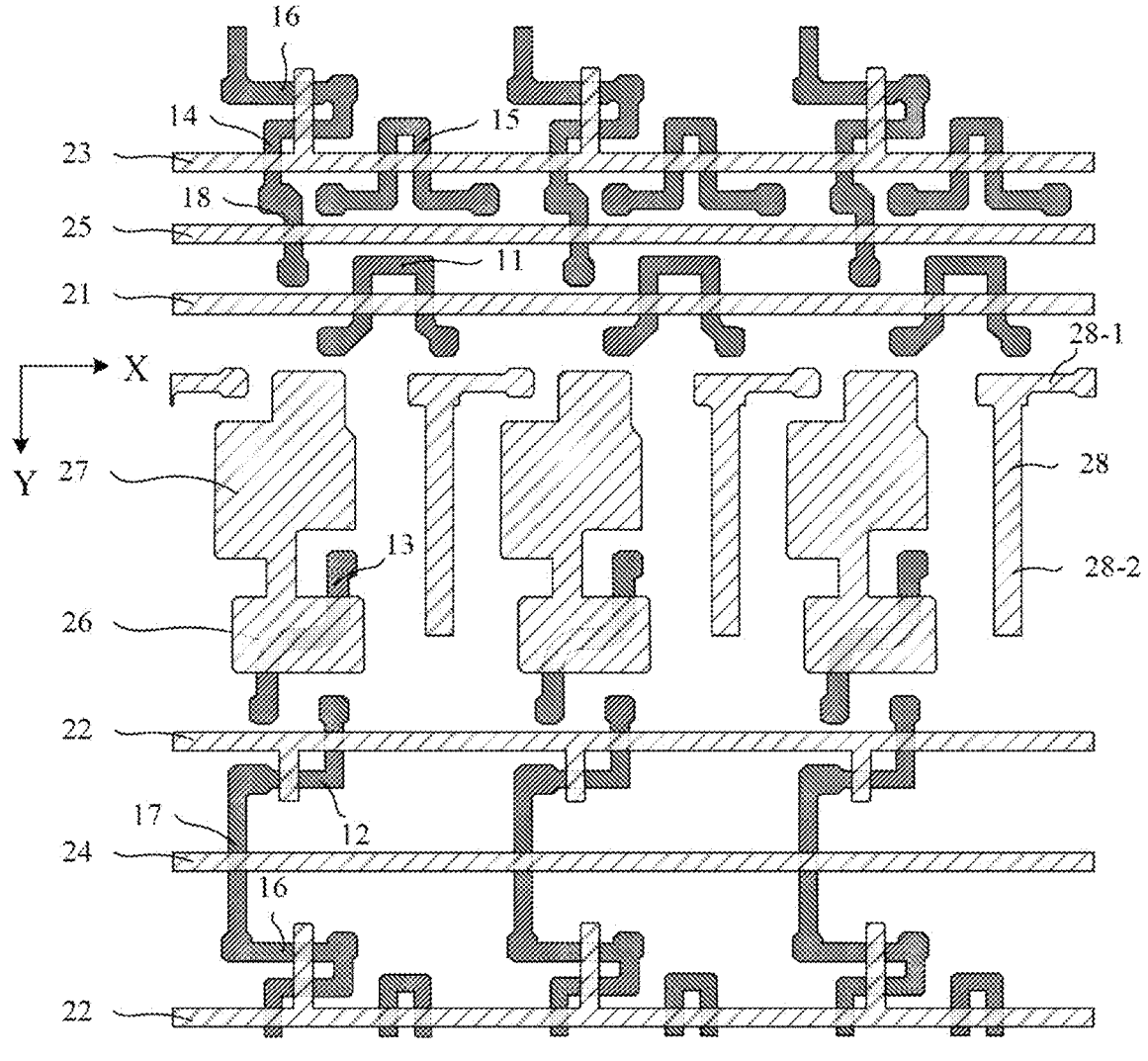
FIG. 8 is a schematic diagram after a pattern of a first conducting layer is formed in accordance with an exemplary embodiment of the present disclosure.

(2) A pattern of a first conducting layer is formed. In an exemplary embodiment, forming a pattern of a first conducting layer may include: depositing sequentially a second insulating thin film and a first metal thin film on the base substrate, on which the aforementioned pattern is formed, and patterning the first metal thin film through a patterning process to form a second insulating layer overlying the pattern of the semiconductor layer and a pattern of a first conducting layer arranged on the second insulating layer. The pattern of the first conducting layer at least includes: the first scan signal line 21, the second scan signal line 22, the third scan signal line 23, the first light emitting control line 24, the second light emitting control line 25, the storage capacitor first polar plate 26, the threshold capacitor first polar plate 27 and the first electrode 28, as shown in FIG. 8.

In an exemplary embodiment, the first scan signal line 21, the second scan signal line 22, the third scan signal line 23, the first light emitting control line 24 and the second light emitting control line 25 extend along the first direction X. The storage capacitor first polar plate 26, the threshold capacitor first polar plate 27 and the first electrode 28 are arranged between the first scan signal line 21 and the second scan signal line 22, and are located in the middle of the sub-pixel in the second direction Y. The storage capacitor first polar plate 26 is close to the second scan signal line 22, and the threshold capacitor first polar plate 27 is close to the first scan signal line 21. The first light emitting control line 24 is arranged at one side of the second scan signal line 22 away from the storage capacitor first polar plate 26, the third scan signal line 23 and the second light emitting control line 25 are arranged at one side of the first scan signal line 21 away from the threshold capacitor first polar plate 27, and the second light emitting control line 25 is arranged between the first scan signal line 21 and the third scan signal line 23.

In an exemplary embodiment, the first electrode 28 is in the shape of a fold line, and includes a first electrode segment 28-1 extending along the first direction X and a second electrode segment 28-2 extending along the second direction Y. An end of the first electrode segment 28-1 and an end of the second electrode segment 28-2 which are adjacent to each other are connected to each other, the first electrode segment 28-1 is configured to be connected to a second power line formed subsequently, and the second electrode segment 28-2 overlaps with a data signal line formed subsequently, and is configured to avoid the influence of jumps of the data voltage on the data signal line on the critical node, preventing the jumps of the data voltage from affecting the potential of the critical node of the pixel driving circuit, thereby improving the display effect.

In an exemplary embodiment, the outline of the storage capacitor first polar plate 26 may be in the shape of a rectangle, corners of which may be provided with a chamfer. The outline of the threshold capacitor first polar plate 27 may be in the shape of a rectangle, a corner of the rectangle close to the second electrode segment 28-2 of the first electrode 28 is provided with a groove, a corner of the rectangle close to the third active layer 13 is provided with a groove, and the corners may be provided with a chamfer.

In an exemplary embodiment, the storage capacitor first polar plate 26 and the threshold capacitor first polar plate 27 are connected to each other through a connecting line. In a possible exemplary embodiment, the storage capacitor first polar plate 26 and the threshold capacitor first polar plate 27 are connected to each other to form an integrated structure.

In an exemplary embodiment, the first scan signal line 21, the second scan signal line 22, the third scan signal line 23, the first light emitting control line 24 and the second light emitting control line 25 may be arranged at equal intervals or at unequal intervals, the interval being a dimension in the second direction Y.

In an exemplary embodiment, a plurality of second gate blocks may be arranged on the second scan signal line 22, each second gate block is arranged in one sub-pixel, one end of the second gate block is connected to the second scan signal line 22, and the other end of the second gate block extends along the second direction Y to form a double-gate second transistor. A plurality of third gate blocks may be arranged on the third scan signal line 23, each third gate block is arranged in one sub-pixel, one end of the third gate block is connected to the third scan signal line 23, and the other end of the third gate block extends along the opposite direction of the second direction Y to form a double-gate fourth transistor.

In an exemplary embodiment, an area where the first scan signal line 21 overlaps with the first active layer 11 serves as the gate electrode of the first transistor T1 (double-gate structure), an area where the second scan signal line 22 overlaps with the second active layer 12 serves as the gate electrode of the second transistor T2 (double-gate structure), there is an overlapping area between an orthographic projection of the storage capacitor first polar plate 26 on the base substrate and an orthographic projection of the third active layer 13 on the base substrate, the storage capacitor first polar plate 26 also serves as the gate electrode of the third transistor T3, an area where the third scan signal line 23 overlaps with the fourth active layer 14 serves as the gate electrode of the fourth transistor T4 (double gate structure), an area where the third scan signal line 23 overlaps with the fifth active layer 15 serves as the gate electrode of the fifth transistor T5 (double gate structure), an area where the second scan signal line 22 overlaps with the sixth active layer 16 serves as the gate electrode of the sixth transistor T6, an area where the first light emitting control line 24 overlaps with the seventh active layer 17 serves as the gate electrode of the seventh transistor T7, and an area where the second light emitting control line 25 overlaps with the eighth active layer 18 serves as the gate electrode of the eighth transistor T8.

In an exemplary embodiment, the first transistor T1, the second transistor T2, the fourth transistor T4, the fifth transistor T5, the sixth transistor T6, the seventh transistor T7, and the eighth transistor T8 are all switching transistors, and the third transistor T3 is a driving transistor.

In an exemplary embodiment, there is no overlapping area between an orthographic projection of the threshold capacitor first polar plate 27 on the base substrate and the orthographic projection of the third active layer 13 on the base substrate.

In an exemplary embodiment, after the pattern of the first conducting layer is formed, the semiconductor layer may be metalized by using the first conducting layer as a shield. A region of the semiconductor layer, which is shielded by the first conducting layer, forms the channel regions of the first transistor T1 to the eighth transistor T8, and a region of the semiconductor layer, which is not shielded by the first conducting layer, is metalized, that is, the first regions and the second regions of the first active layer to the eighth active layer are all metalized.

Figure 9:
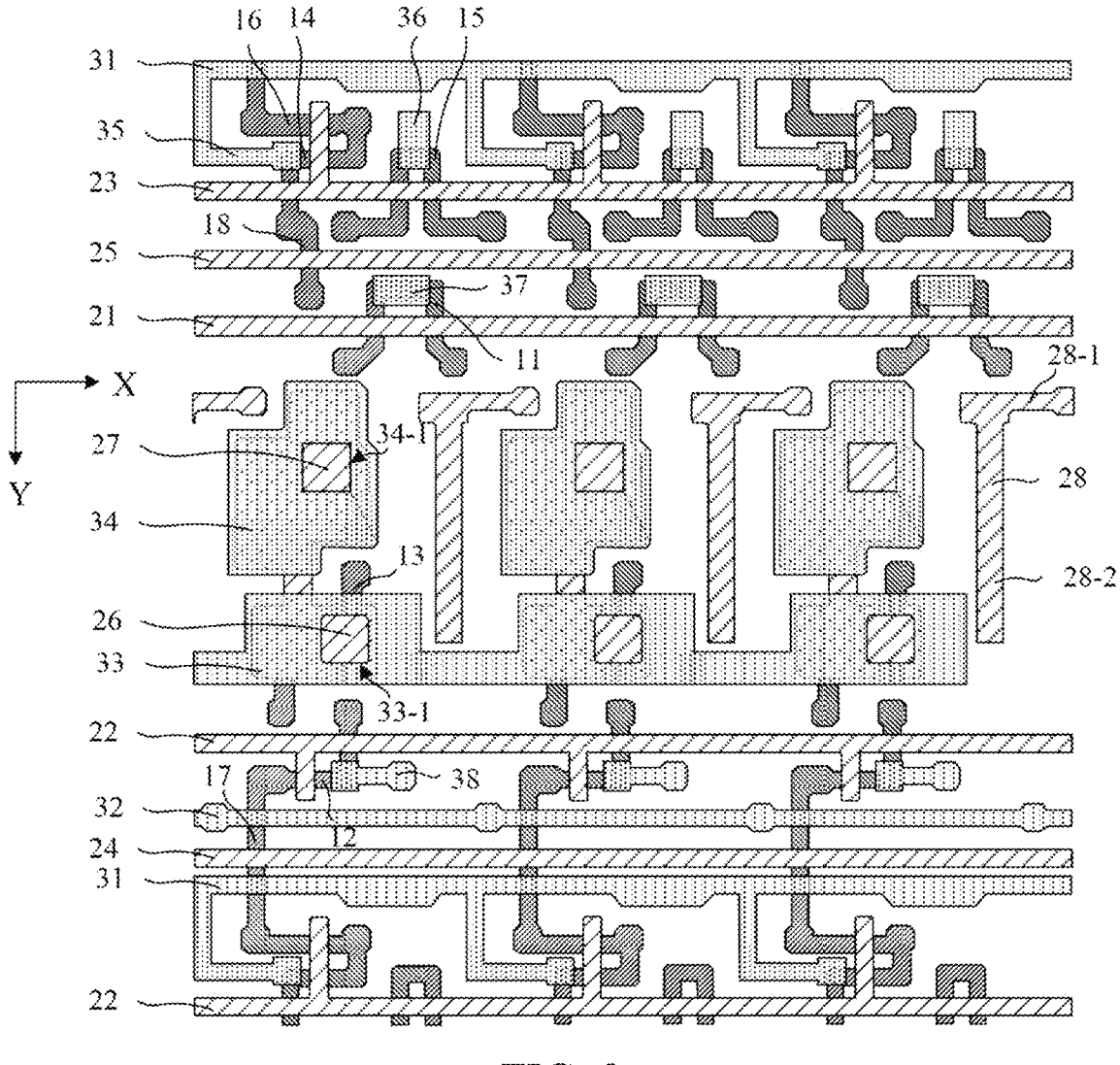
FIG. 9 is a schematic diagram after a pattern of a second conducting layer is formed in accordance with an exemplary embodiment of the present disclosure.

(3) A pattern of a second conducting layer is formed. In an exemplary embodiment, forming a pattern of a second conducting layer may include: depositing sequentially a third insulating thin film and a second metal thin film on the base substrate, on which the aforementioned patterns are formed, and patterning the second metal thin film through a patterning process to form a third insulating layer overlying the first conducting layer and a pattern of a second conducting layer arranged on the third insulating layer. The pattern of the second conducting layer at least includes: the initial signal line 31, the first connecting line 32, the storage capacitor second polar plate 33 and the threshold capacitor second polar plate 34, as shown in FIG. 9.

In an exemplary embodiment, the initial signal line 31 and the first connecting line 32 extend along the first direction X, the initial signal line 31 is arranged at one side of the third scan signal line 23 away from the second light emitting control line 25, the first connecting line 32 is arranged between the second scan signal line 22 and the first light emitting control line 24, and the first connecting line 32 is configured to be connected to a reference signal line formed subsequently, so that each sub-pixel in a sub-pixel row has the same reference voltage, thereby improving display uniformity. The initial signal line 31 and the first connecting line 32 may be arranged at equal intervals or at unequal intervals.

In an exemplary embodiment, the storage capacitor second polar plate 33 and the threshold capacitor second polar plate 34 are arranged between the first scan signal line 21 and the second scan signal line 22, and the storage capacitor second polar plate 33 and the threshold capacitor second polar plate 34 are spaced apart from each other.

In an exemplary embodiment, the outline of the storage capacitor second polar plate 33 may be in the shape of a rectangle, corners of which may be provided with a chamfer. There is an overlapping area between an orthographic projection of the storage capacitor second polar plate 33 on the base substrate and the orthographic projection of the storage capacitor first polar plate 26 on the base substrate. The storage capacitor second polar plate 33 is provided with a first opening 33-1, the first opening 33-1 may be in the shape of a rectangle and is located in the middle of the storage capacitor second polar plate 33. The first opening 33-1 causes the storage capacitor second polar plate 33 to form a ring structure. The first opening 33-1 exposes the third insulating layer overlying the storage capacitor first polar plate 26, and the orthographic projection of the storage capacitor first polar plate 26 on the base substrate contains an orthographic projection of the first opening 33-1 on the base substrate. In an exemplary embodiment, the first opening 33-1 is configured to accommodate a first via hole formed subsequently. The first via hole is located in the first opening 33-1 and exposes the storage capacitor first polar plate 26, so that a first connecting electrode subsequently formed is connected to the storage capacitor first polar plate 26 through the first via hole.

In an exemplary embodiment, the shape of the threshold capacitor second polar plate 34 is similar to that of the threshold capacitor first polar plate 27, which is the shape of a rectangle with two corners being provided with a groove. There is an overlapping area between an orthographic projection of the threshold capacitor second polar plate 34 on the base substrate and an orthographic projection of the threshold capacitor first polar plate 27 on the base substrate. The threshold capacitor second polar plate 34 is provided with a second opening 34-1, and the second opening 34-1 may be in the shape of a rectangle and is located in the middle of the threshold capacitor second polar plate 34. The second opening 34-1 causes the threshold capacitor second polar plate 34 to form a ring structure. The second opening 34-1 exposes the third insulating layer overlying the threshold capacitor first polar plate 27, and the orthographic projection of the threshold capacitor first polar plate 27 on the base substrate contains an orthographic projection of the second opening 34-1 on the base substrate. In an exemplary embodiment, the second opening 34-1 is configured to accommodate a second via hole formed subsequently. The second via hole is located in the second opening 34-1 and exposes the threshold capacitor first polar plate 27, so that a second connecting electrode subsequently formed is connected to the threshold capacitor first polar plate 27 through the second via hole.

In an exemplary embodiment, the storage capacitor first polar plate 26 and the storage capacitor second polar plate 33 constitute the storage capacitor Cst of the pixel driving circuit, the storage capacitor first polar plate 26 serves as the second end of the storage capacitor Cst and also serves as the gate electrode of the third transistor T3, and the storage capacitor second polar plate 33 serves as the first end of the storage capacitor Cst and is connected to a first power line VDD formed subsequently.

In an exemplary embodiment, the threshold capacitor first polar plate 27 and the threshold capacitor second polar plate 34 constitute the threshold capacitor CVth of the pixel driving circuit, the threshold capacitor first polar plate 27 serves as the first end of the threshold capacitor CVth and is connected to the second pole of the first transistor T1 formed subsequently, and the threshold capacitor second polar plate 34 serves as the second end of the threshold capacitor CVth and is connected to the second end of the storage capacitor Cst.

In an exemplary embodiment, the storage capacitor second polar plates 33 of adjacent sub-pixels in one sub-pixel row are connected to each other by connecting lines. Since the storage capacitor second polar plate 33 is connected to the first power line formed subsequently, the storage capacitor second polar plates 33 connected to each other in one sub-pixel row also serve as the first power connecting lines, so that all sub-pixels in one sub-pixel row have the same supply voltage, thereby improving display uniformity.

In an exemplary embodiment, the threshold capacitor second polar plates 34 of adjacent sub-pixels in one sub-pixel row are spaced apart from each other, so that the threshold capacitor CVth of each sub-pixel only reflects the threshold voltage of the driving transistor of that sub-pixel.

In an exemplary embodiment, the first sub-polar plate 35, the second sub-polar plate 36, the third sub-polar plate 37 and the fourth sub-polar plate 38 may be provided in each sub-pixel.

The first sub-polar plate 35 may be in the shape of "L". One end of the first sub-polar plate 35 is connected to the initial signal line 31, and there is an overlapping area between an orthographic projection of the other end of the first sub-polar plate 35 on the base substrate and the orthographic projection of the fourth active layer 14, located between the gate electrodes of two fourth transistors T4, on the base substrate. The first sub-polar plate 35 is configured to introduce parasitic capacitance at the double-gate intermediate node of the fourth transistor T4 to stabilize the potential of the critical node in the pixel driving circuit, and further improve flicker of the display substrate to adjust an off-state leakage current of the fourth transistor T4.

The second sub-polar plate 36 may be in the shape of "1". There is an overlapping area between the orthographic projection of the second sub-polar plate 36 on the base substrate and the orthographic projection of the fifth active layer 15, located between the gate electrodes of two fifth transistors T5, on the base substrate. The second sub-polar plate 36 is configured to introduce parasitic capacitance at the double-gate intermediate node of the fifth transistor T5 to adjust an off-state leakage current of the fifth transistor T5, stabilize the potential of the critical node in the pixel driving circuit, and further improve flicker of the display substrate.

The third sub-polar plate 37 may be in the shape of "—". There is an overlapping area between the orthographic projection of the third sub-polar plate 37 on the base substrate and the orthographic projection of the first active layer 11, located between the gate electrodes of two first transistors T1, on the base substrate. The third sub-polar plate 37 is configured to introduce parasitic capacitance at the double-gate intermediate node of the first transistor T1 to adjust an off-state leakage current of the first transistor T1, stabilize the potential of the critical node in the pixel driving circuit, and further improve flicker of the display substrate. The fourth sub-polar plate 38 may be in the shape of "—". There is an overlapping area between the orthographic projection of the fourth sub-polar plate 38 on the base substrate and the orthographic projection of the second active layer 12, located between the gate electrodes of two second transistors T2, on the base substrate. The fourth sub-polar plate 38 is configured to introduce parasitic capacitance at the double-gate intermediate node of the second transistor T2 to adjust an off-state leakage current of the second transistor T2, stabilize the potential of the critical node in the pixel driving circuit, and further improve flicker of the display substrate.

Figure 10:
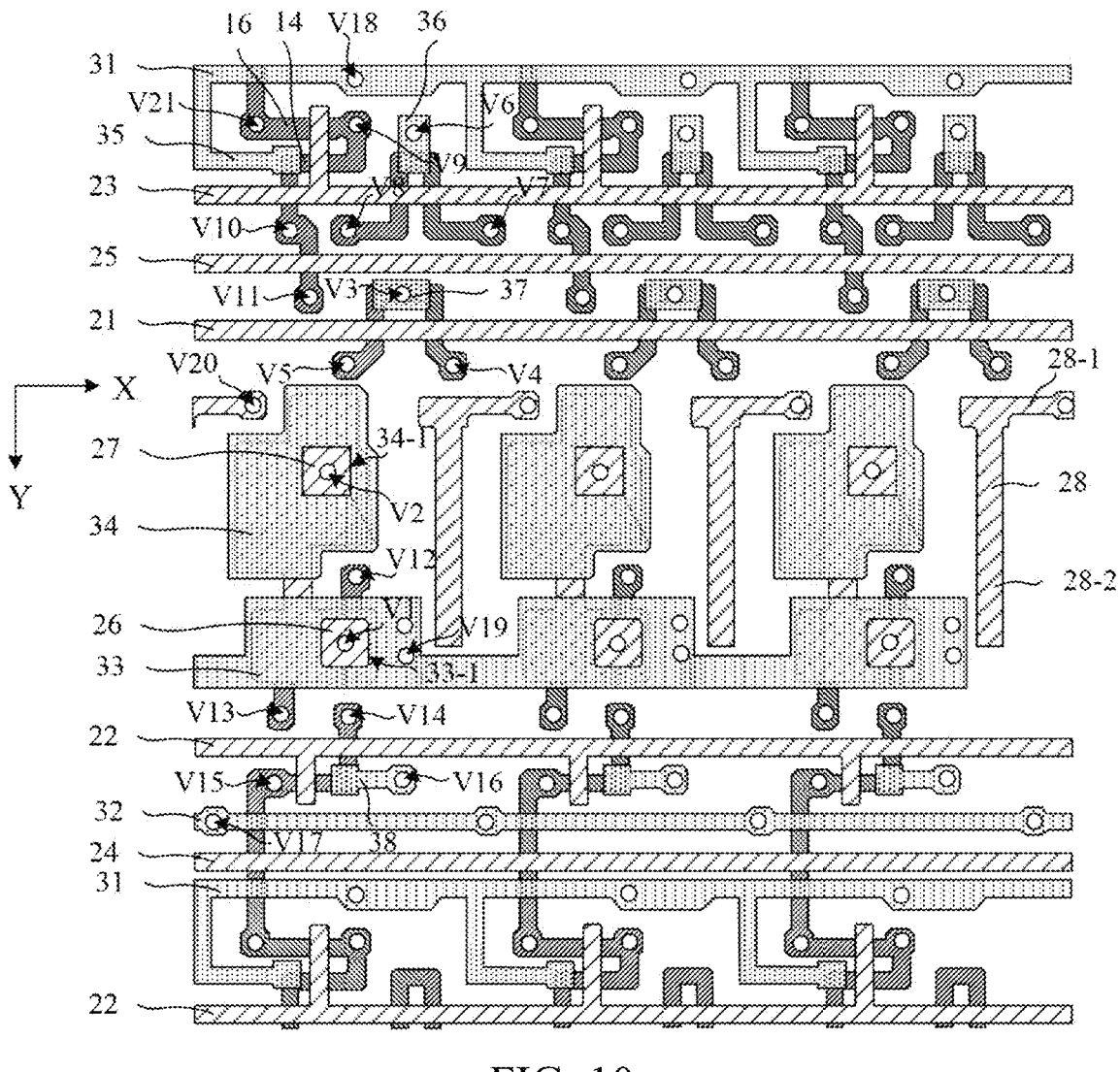
FIG. 10 is a schematic diagram after a pattern of a fourth insulating layer is formed in accordance with an exemplary embodiment of the present disclosure.

(4) A pattern of a fourth insulating layer is formed. In an exemplary embodiment, forming a pattern of a fourth insulation layer may include: depositing a fourth insulating thin film on the base substrate, on which the aforementioned patterns are formed, and patterning the fourth insulating thin film through a patterning process to form a fourth insulating layer overlying the second conducting layer. The fourth insulating layer is provided with a plurality of via holes which at least include: a first via hole V1, a second via hole V2, a third via hole V3, a fourth via hole V4, a fifth via hole V5, a sixth via hole V6, a seventh via hole V7, an eighth via hole V8, a ninth via hole V9, a tenth via hole V10, an eleventh via hole V11, a twelfth via hole V12, a thirteenth via hole V13, a fourteenth via hole V14, a fifteenth via hole V15, a sixteenth via hole V16, a seventeenth via hole V17, an eighteenth via hole V18, a nineteenth via hole V19, a twentieth via hole V20 and a twenty-first via hole V21, as shown in FIG. 10.

In an exemplary embodiment, the first via hole V1 is located in an area where the first opening 33-1 provided in the storage capacitor second polar plate 33 is located, an orthographic projection of the first via hole V1 on the base substrate is located within the range of the orthographic projection of the first opening 33-1 on the base substrate, the fourth insulating layer and the third insulating layer in the first via hole V1 are etched away to expose a surface of the storage capacitor first polar plate 26, and the first via hole V1 is configured in such a way that the subsequently formed first connecting electrode is connected to the storage capacitor first polar plate 26 through this via hole.

In an exemplary embodiment, the second via hole V2 is located in an area where the second opening 34-1 provided in the threshold capacitor second polar plate 34 is located, the fourth insulating layer and the third insulating layer in the second via hole V2 are etched away to expose a surface of the threshold capacitor first polar plate 27, and the second via hole V2 is configured in such a way that the subsequently formed second connecting electrode is connected to the threshold capacitor first polar plate 27 through this via hole.

In an exemplary embodiment, the third via hole V3 is located in an area where the third sub-polar plate 37 is located, the fourth insulating layer in the third via hole V3 is etched away to expose a surface of the third sub-polar plate 37, and the third via hole V3 is configured in such a way that the subsequently formed first power line is connected to the third sub-polar plate 37 through this via hole, to provide a constant supply voltage for the third sub-polar plate 37.

In an exemplary embodiment, the fourth via hole V4 is located in an area where the first region of the first active layer is located, the fourth insulating layer, the third insulating layer and the second insulating layer in the fourth via hole V3 are etched away to expose a surface of the first region of the first active layer, and the fourth via hole V4 is configured in such a way that the subsequently formed third connecting electrode is connected to the first active layer through this via hole.

In an exemplary embodiment, the fifth via hole V5 is located in an area where the second region of the first active layer is located, the fourth insulating layer, the third insulating layer and the second insulating layer in the fifth via hole V5 are etched away to expose a surface of the second region of the first active layer, and the fifth via hole V5 is configured in such a way that the subsequently formed fourth connecting electrode is connected to the first active layer through this via hole.

In an exemplary embodiment, the sixth via hole V6 is located in an area where the second sub-polar plate 36 is located, the fourth insulating layer in the sixth via hole V6 is etched away to expose a surface of the second sub-polar plate 36, and the sixth via hole V6 is configured in such a way that the subsequently formed first power line is connected to the second sub-polar plate 36 through this via hole, to provide a constant supply voltage for the second sub-polar plate 36.

In an exemplary embodiment, the seventh via hole V7 is located in an area where the first region of the fifth active layer is located, the fourth insulating layer, the third insulating layer and the second insulating layer in the seventh via hole V7 are etched away to expose a surface of the first region of the fifth active layer, and the seventh via hole V7 is configured in such a way that the subsequently formed reference signal line is connected to the fifth active layer through this via hole.

In an exemplary embodiment, the eighth via hole V8 is located in an area where the second region of the fifth active layer is located, the fourth insulating layer, the third insulating layer and the second insulating layer in the eighth via hole V8 are etched away to expose a surface of the second region of the fifth active layer, and the eighth via hole V8 is configured in such a way that the subsequently formed fourth connecting electrode is connected to the fifth active layer through this via hole.

In an exemplary embodiment, the ninth via hole V9 is located in an area where the first region of the fourth active layer (which is also the first region of the sixth active layer) is located, the fourth insulating layer, the third insulating layer and the second insulating layer in the ninth via hole V9 are etched away to expose a surface of the first region of the fourth active layer, and the ninth via hole V9 is configured in such a way that the subsequently formed fifth connecting electrode is connected to the fourth active layer through this via hole.

In an exemplary embodiment, the tenth via hole V10 is located in an area where the second region of the fourth active layer (which is also the first region of the eighth active layer) is located, the fourth insulating layer, the third insulating layer and the second insulating layer in the tenth via hole V10 are etched away to expose a surface of the second region of the fourth active layer, and the tenth via hole V10 is configured in such a way that the subsequently formed sixth connecting electrode is connected to the fourth active layer through this via hole.

In an exemplary embodiment, the eleventh via hole V11 is located in an area where the second region of the eighth active layer is located, the fourth insulating layer, the third insulating layer and the second insulating layer in the eleventh via hole V11 are etched away to expose a surface of the second region of the eighth active layer, and the eleventh via hole V11 is configured in such a way that the subsequently formed second connecting electrode is connected to the eighth active layer through this via hole.

In an exemplary embodiment, the twelfth via hole V12 is located in an area where the first region of the third active layer is located, the fourth insulating layer, the third insulating layer and the second insulating layer in the twelfth via hole V12 are etched away to expose a surface of the first region of the third active layer, and the twelfth via hole V12 is configured in such a way that the subsequently formed first power line is connected to the third active layer through this via hole.

In an exemplary embodiment, the thirteenth via hole V13 is located in an area where the second region of the third active layer is located, the fourth insulating layer, the third insulating layer and the second insulating layer in the thirteenth via hole V13 are etched away to expose a surface of the second region of the third active layer, and the thirteenth via hole V13 is configured in such a way that the subsequently formed seventh connecting electrode is connected to the third active layer through this via hole.

In an exemplary embodiment, the fourteenth via hole V14 is located in an area where the first region of the second active layer is located, the fourth insulating layer, the third insulating layer and the second insulating layer in the fourteenth via hole V14 are etched away to expose a surface of the first region of the second active layer, and the fourteenth via hole V14 is configured in such a way that the subsequently formed first connecting electrode is connected to the second active layer through this via hole.

In an exemplary embodiment, the fifteenth via hole V15 is located in an area where the second region of the second active layer (which is also the first region of the seventh active layer) is located, the fourth insulating layer, the third insulating layer and the second insulating layer in the fifteenth via hole V15 are etched away to expose a surface of the second region of the second active layer, and the fifteenth via hole V15 is configured in such a way that the subsequently formed seventh connecting electrode is connected to the second active layer through this via hole.

In an exemplary embodiment, the sixteenth via hole V16 is located in an area where the fourth sub-polar plate 38 is located, the fourth insulating layer in the sixteenth via hole V16 is etched away to expose a surface of the fourth sub-polar plate 38, and the sixteenth via hole V16 is configured in such a way that the subsequently formed first power line is connected to the fourth sub-polar plate 38 through this via hole, to provide a constant supply voltage for the fourth sub-polar plate 38.

In an exemplary embodiment, the seventeenth via hole V17 is located in an area where the first connecting line 32 is located, the fourth insulating layer in the seventeenth via hole V17 is etched away to expose a surface of the first connecting line, and the seventeenth via hole V17 is configured in such a way that the subsequently formed reference signal line is connected to the first connecting line 32 through this via hole.

In an exemplary embodiment, the eighteenth via hole V18 is located in an area where the initial signal line 31 is located, the fourth insulating layer in the eighteenth via hole V18 is etched away to expose a surface of the initial signal line 31, and the eighteenth via hole V18 is configured in such a way that the subsequently formed fifth connecting electrode 45 is connected to the initial signal line 31 through this via hole.

In an exemplary embodiment, the nineteenth via hole V19 is located in an area where the storage capacitor second polar plate 33 is located, the fourth insulating layer in the nineteenth via hole V19 is etched away to expose a surface of the storage capacitor second polar plate 33, and the nineteenth via hole V19 is configured in such a way that the subsequently formed first power line is connected to the storage capacitor second polar plate 33 through this via hole. In an exemplary embodiment, there may be one or more nineteenth via holes V19, and a plurality of nineteenth via holes V19 are arranged sequentially along the second direction Y. The plurality of nineteenth via holes V19 may improve the reliability of the connection of the first power line with the storage capacitor second polar plate 33.

In an exemplary embodiment, the twentieth via hole V20 is located in an area where the second electrode segment 28-2 of the first electrode 28 is located, the fourth insulating layer and the third insulating layer in the twentieth via hole V20 are etched away to expose a surface of the second electrode segment 28-2 of the first electrode 28, and the twentieth via hole V20 is configured in such a way that the subsequently formed interlayer connecting electrode is connected to the second electrode segment 28-2 of the first electrode 28 through this via hole.

In an exemplary embodiment, the twenty-first via hole V21 is located in an area where the second region of the sixth active layer (which is also the second region of the seventh active layer) is located, the fourth insulating layer, the third insulating layer and the second insulating layer in the twenty-first via hole V21 are etched away to expose a surface of the second region of the sixth active layer, and the twenty-first via hole V21 is configured in such a way that the subsequently formed ninth connecting electrode is connected to the second active layer through this via hole.

Figure 11:
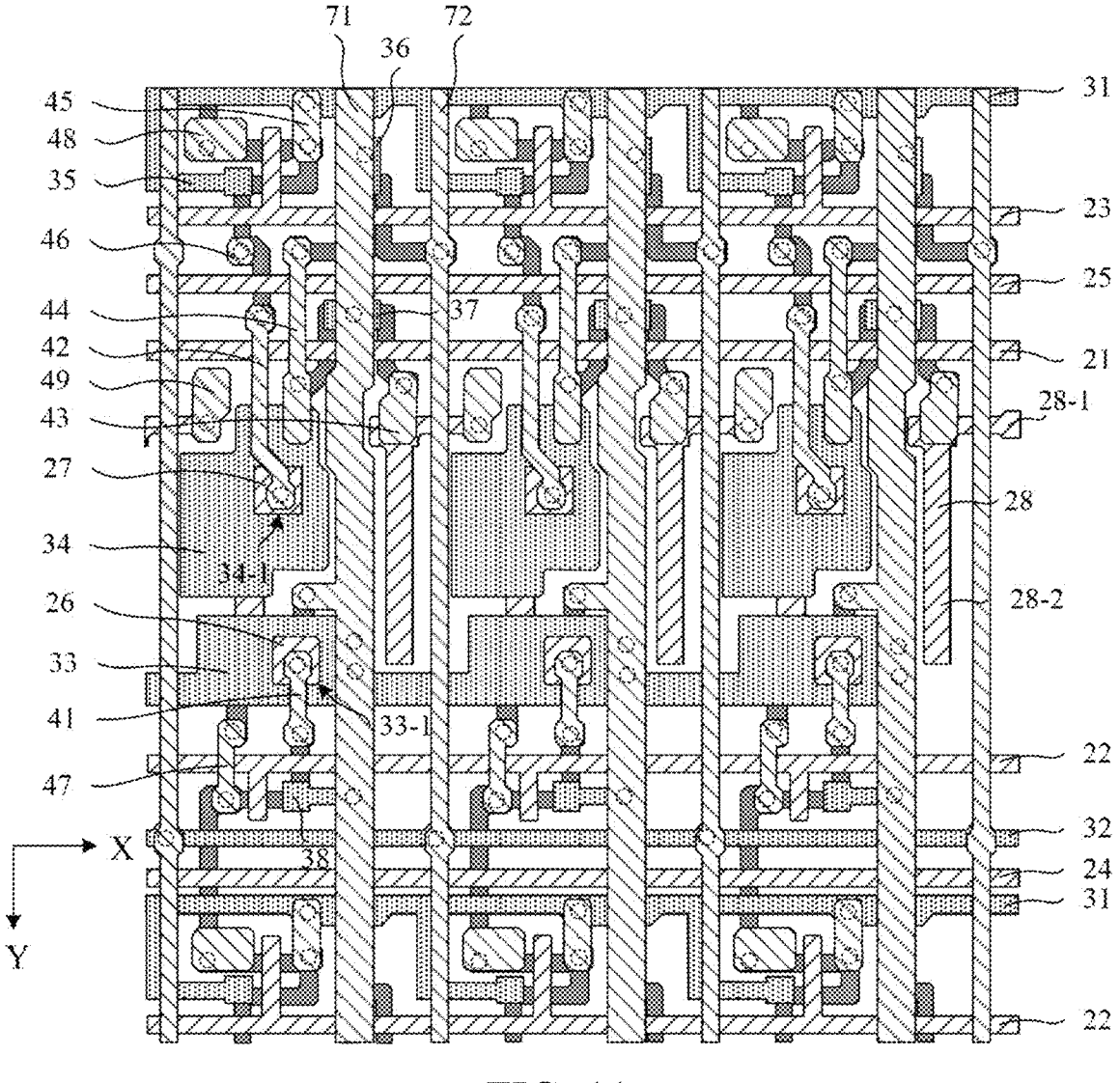
FIG. 11 is a schematic diagram after a pattern of a third conducting layer is formed in accordance with an exemplary embodiment of the present disclosure.

(5) A pattern of a third conducting layer is formed. In an exemplary embodiment, forming a pattern of a third conducting layer may include: depositing a third metal thin film on the base substrate, on which the aforementioned patterns are formed, and patterning the third metal thin film through a patterning process to form a third conducting layer arranged on the fourth insulating layer. The third conducting layer at least includes: a first connecting electrode 41, a second connecting electrode 42, a third connecting electrode 43, a fourth connecting electrode 44, a fifth connecting electrode 45, a sixth connecting electrode 46, a seventh connecting electrode 47, an eighth connecting electrode 48, an interlayer connecting electrode 49, the first power line 71 and the reference signal line 72, as shown in FIG. 11.

In an exemplary embodiment, the first power line 71 and the reference signal line 72 extend along the second direction Y. The first power line 71 and the reference signal line 72 may be arranged at equal intervals or at unequal intervals, and may be straight lines or fold lines.

In an exemplary embodiment, the first power line 71 is connected to the third sub-polar plate 37 through the third via hole V3, is connected to the second sub-polar plate 36 through the sixth via hole V6, is connected to the first region of the third active layer through the twelfth via hole V12, is connected to the fourth sub-polar plate 38 through the sixteenth via hole V16, and is connected to the storage capacitor second polar plate 33 through the nineteenth via hole V19.

In an exemplary embodiment, the reference signal line 72 is connected to the first region of the fifth active layer through the seventh via hole V7 and is connected to the first connecting line 32 through the seventeenth via hole V17.

In the exemplary embodiment, the first connecting electrode 41 is in the shape of a strip extending along the second direction Y, with one end connected to the storage capacitor first polar plate 26 through the first via hole V1 and the other end connected to the first region of the second active layer through the fourteenth via hole V14, so that the first pole of the second transistor T2 is connected to the storage capacitor first polar plate 26. Since the storage capacitor first polar plate 26 also serves as the gate electrode of the third transistor T3, the first connecting electrode 41 serves as the first pole of the second transistor T2, so that the first pole of the second transistor T2, the gate electrode of the third transistor T3 and the second end of the storage capacitor Cst have the same potential.

In the exemplary embodiment, the second connecting electrode 42 is in the shape of a strip extending along the second direction Y, with one end connected to the threshold capacitor first polar plate 27 through the second via hole V2 and the other end connected to the second region of the eighth active layer through the eleventh via hole V11, so that the second pole of the eighth transistor T8 is connected to the threshold capacitor first polar plate 27. Since the threshold capacitor first polar plate 27 and the storage capacitor first polar plate 26 are connected to each other to form an integrated structure, the second connecting electrode 42 serves as the second pole of the eighth transistor T8, so that the first pole of the second transistor T2, the gate electrode of the third transistor T3, the second pole of the eighth transistor T8, the second end of the storage capacitor Cst and the second end of the threshold capacitor CVth have the same potential (i.e. the first node N1).

In an exemplary embodiment, the third connecting electrode 43 is arranged between the first power line 71 and the reference signal line 72, and is connected to the first region of the first active layer through the fourth via hole V4. The third connecting electrode 43 serves as the first pole of the first transistor T1, and is configured to be connected to the subsequently formed data signal line.

In an exemplary embodiment, the fourth connecting electrode 44 is in the shape of a strip extending along the second direction Y, with one end connected to the second region of the first active layer through the fifth via hole V5 and the other end connected to the second region of the fifth active layer through the eighth via hole V8. The fourth connecting electrode 44 also serves as the second pole of the first transistor T1 and the second pole of the fifth transistor T5, so that the second pole of the first transistor T1 and the second pole of the fifth transistor T5 have the same potential (i.e., the second node N2).

In an exemplary embodiment, the fifth connecting electrode 45 is in the shape of a strip extending along the second direction Y, with one end connected to the first region of the fourth active layer (which is also the first region of the sixth active layer) through the ninth via hole V9 and the other end connected to the initial signal line 31 through the eighteenth via hole V18. The fifth connecting electrode 45 also serves as the first pole of the fourth transistor T4 and the first pole of the sixth transistor T6, so that both the first pole of the fourth transistor T4 and the sixth transistor T6 are connected to the initial signal line 31.

In an exemplary embodiment, the sixth connecting electrode 46 is in the shape of a rectangle and is connected to the second region of the fourth active layer (which is also the first region of the eighth active layer) through the tenth via hole V10. The sixth connecting electrode 46 also serves as the second pole of the fourth transistor T4 and the first pole of the eighth transistor T8, so that the connection of the second pole of the fourth transistor T4 with the first pole of the eighth transistor T8 is implemented.

In an exemplary embodiment, the seventh connecting electrode 47 is in the shape of a strip extending along the second direction Y, with one end connected to the second region of the third active layer through the thirteenth via hole V13 and the other end connected to the second region of the second active layer (which is also the first region of the seventh active layer) through the fifteenth via hole V15. The seventh connecting electrode 47 also serves as the second pole of the second transistor T2, the second pole of the third transistor T3 and the first pole of the seventh transistor T7, so that the second pole of the second transistor T2, the second pole of the third transistor T3 and the first pole of the seventh transistor T7 have the same potential (i.e., the third node N3).

In an exemplary embodiment, the eighth connecting electrode 48 is in the shape of a rectangle, and is connected to the second region of the sixth active layer (which is also the second region of the seventh active layer) through the twenty-first via hole V21. The eighth connecting electrode 48 also serves as the second pole of the sixth transistor T6 and the second pole of the seventh transistor T7, so that the connection of the second pole of the sixth transistor T6 with the second pole of the seventh transistor T7 is implemented.

In an exemplary embodiment, the interlayer connecting electrode 49 is arranged between the reference signal line 72 and the second connecting electrode 42, is connected to the first electrode 28 through the twentieth via hole V20, and is configured to be connected to the subsequently formed second power line.

Figure 12:
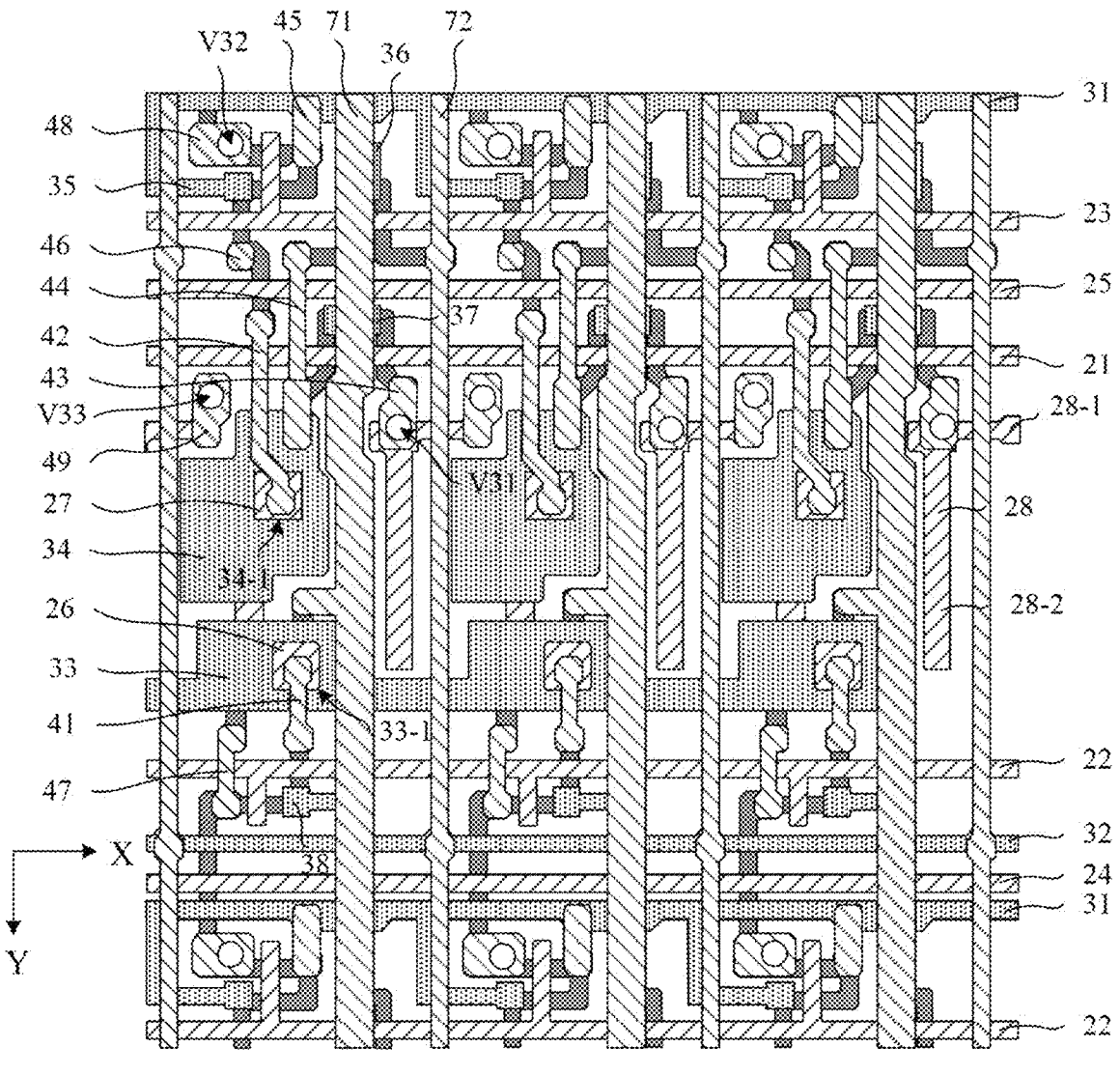
FIG. 12 is a schematic diagram after a pattern of a fifth insulating layer is formed in accordance with an exemplary embodiment of the present disclosure.

(6) A pattern of a fifth insulating layer is formed. In an exemplary embodiment, forming a pattern of a fifth insulating layer may include: coating a fifth insulating thin film on the base substrate, on which the aforementioned patterns are formed, and patterning the fifth insulating thin film through a patterning process to form a fifth insulating layer overlying the third conducting layer. The fifth insulating layer is provided with a plurality of via holes, which at least include: a thirty-first via hole V31, a thirty-second via hole V32 and a thirty-third via hole V33, as shown in FIG. 12.

In an exemplary embodiment, the thirty-first via hole V31 is located in an area where the third connecting electrode 43 is located, the fifth insulating layer in the thirty-first via hole V31 is removed to expose a surface of the third connecting electrode 43, and the thirty-first via hole V31 is configured in such a way that the subsequently formed data signal line is connected to the third connecting electrode 43 through this via hole.

In an exemplary embodiment, the thirty-second via hole V32 is located in an area where the eighth connecting electrode 48 is located, the fifth insulating layer in the thirty-second via hole V32 is removed to expose a surface of the eighth connecting electrode 48, and the thirty-second via hole V32 is configured in such a way that the subsequently formed anode connecting electrode is connected to the eighth connecting electrode 48 through this via hole.

In an exemplary embodiment, the thirty-third via hole V33 is located in an area where the interlayer connecting electrode 49 is located, the fifth insulating layer in the thirty-third via hole V33 is removed to expose a surface of the interlayer connecting electrode 49, and the thirty-third via hole V33 is configured in such a way that a subsequently formed second electrode line is connected to the interlayer connecting electrode 49 through this via hole.

Figure 13:
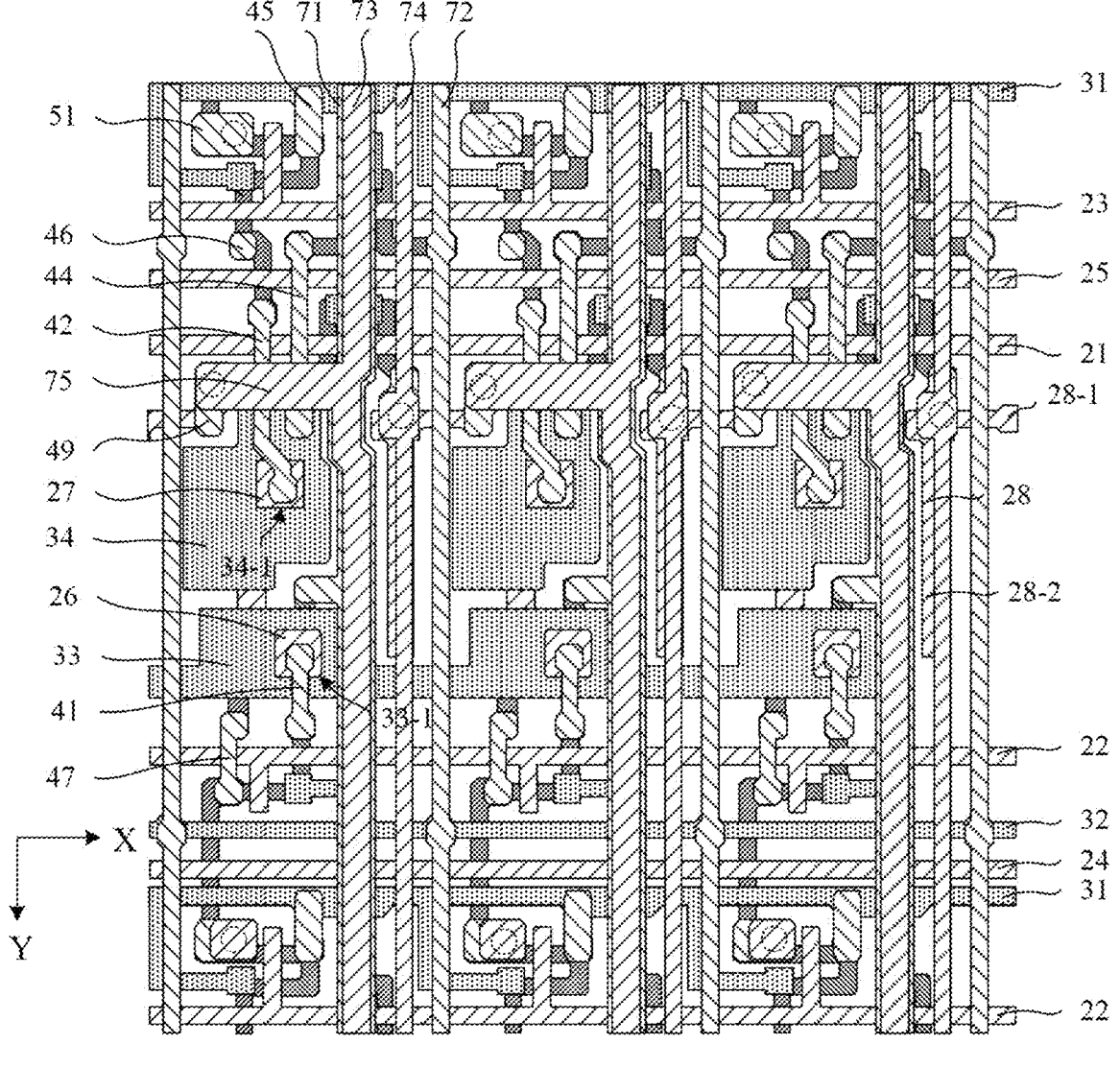
FIG. 13 is a schematic diagram after a pattern of a fourth conducting layer is formed in accordance with an exemplary embodiment of the present disclosure.

(7) A pattern of a fourth conducting layer is formed. In an exemplary embodiment, forming a pattern of a fourth conducting layer may include: depositing a fourth metal thin film on the base substrate, on which the aforementioned patterns are formed, and patterning the fourth metal thin film through a patterning process to form a fourth conducting layer arranged on the fifth insulating layer. The fourth conducting layer at least includes the anode connecting electrode 51, the second power line 73 and the data signal line 74, as shown in FIG. 13.

In an exemplary embodiment, the anode connecting electrode 51 is arranged between the third scan signal line 23 and the initial signal line 31, is in the shape of a rectangle and is connected to the eighth connecting electrode 48 through the thirty-second via hole V32. The anode connecting electrode 51 is configured to be connected to the anode of the light emitting device subsequently formed. Since the eighth connecting electrode 48 also serves as the second pole of the sixth transistor T6 and the second pole of the seventh transistor T7, the connection of the anode of the light emitting device with the pixel driving circuit is implemented, such that the pixel driving circuit can drive the light emitting device to emit light.

In an exemplary embodiment, the data signal line 74 extends along the second direction Y and is arranged between the first power line 71 and the reference signal line 72. The data signal line 74 is connected to the third connecting electrode 43 through the thirty-first via hole V31. Since the third connecting electrode 43 serves as the first pole of the first transistor T1, the connection of the data signal line 74 with the first pole of the first transistor T1 is implemented. There is an overlapping area between an orthographic projection of the data signal line 74 on the base substrate and the orthographic projection of the first electrode 28 on the base substrate.

In an exemplary embodiment, the second power line 73 extends along the second direction Y, and its position corresponds to the position of the first power line 71. A plurality of second power connecting lines 75 are arranged on the second power line 73. Each second power connecting line 75 is provided in one sub-pixel. One end of the second power connecting line 75 is connected to the second power line 73, and the other end of the second power connecting line 75 extends along the opposite direction of the first direction X and is connected to the interlayer connecting electrode 49 through the thirty-third via hole V33. Since the interlayer connecting electrode 49 is connected to the first electrode 28, the connection of the second power line 73 with the first electrode 28 is implemented. The second power line 73 may provide constant low-level signals for the first electrode 28, so that the first electrode 28 may avoid the influence of jumps of the data voltage on the critical node effectively, thereby preventing the jumps of the data voltage from affecting the potential of the critical node of the pixel driving circuit and improving the display effect.

In an exemplary embodiment, the second power line 73 and the data signal line 74 may be arranged at equal intervals or at unequal intervals, and may be straight lines or fold lines.

In an exemplary embodiment, the subsequent manufacturing process may include: forming a planarization layer overlying the pattern of the fourth conducting layer; forming an anode of the light emitting device on the planarization layer; forming a pixel definition layer overlying the anode, the pixel definition layer of each sub-pixel being provided with a pixel opening exposing the anode; then forming an organic light emitting layer by an evaporation process, and forming a cathode on the organic light emitting layer; and finally forming an encapsulation layer. The encapsulation layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is arranged between the first encapsulation layer and the third encapsulation layer, which may ensure that external water vapor cannot enter the light emitting device.

In an exemplary implementation, the base substrate may be a flexible base substrate or a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation, the flexible base substrate may include a first flexible material layer, a first inorganic material layer, a second flexible material layer and a second inorganic material layer which are stacked. Materials of the first and second flexible material layers may be polyimide (PI), polyethylene terephthalate (PET), surface treated polymer soft films, or the like; and materials of the first and second inorganic material layers may be silicon nitride ($SiN_x$), silicon oxide ($SiO_x$), or the like, for improving the water and oxygen resistance of the base substrate. In an exemplary implementation, the thickness of the first flexible material layer may be about 5 μm to 15 μm, for example, 10 μm; the thickness of the second flexible material layer may be about 5 μm to 15 μm, for example, 10 μm; the thickness of the first inorganic material layer may be about 0.3 μm to 0.9 μm, for example, 0.6 μm; and the thickness of the second inorganic material layer may be about 0.3 μm to 0.9 μm, for example, 0.6 μm.

In an exemplary embodiment, the first conducting layer, the second conducting layer, the third conducting layer and the fourth conducting layer may be made of metal materials, such as any one or more of silver (Ag), copper (Cu), aluminum (A1) and molybdenum (Mo), or alloy materials of the above metals, such as an aluminum neodymium alloy (AlNd) or a molybdenum niobium alloy (MoNb), and may be a single-layer structure or a multi-layer composite structure, such as Mo/Cu/Mo, etc. The first conducting layer is referred to as a first gate metal (Gate1) layer, the second conducting layer is referred to as a second gate metal (Gate2) layer, the third conducting layer is referred to as a first source-drain metal (SD1) layer, and the fourth conducting layer is referred to as a second source-drain metal (SD2) layer. The first insulating layer, the second insulating layer, the third insulating layer, the fourth insulating layer and the fifth insulating layer may be made of any one or more of silicon oxide ($SiO_x$), silicon nitride ($SiN_x$) and silicon oxynitride (SiON), and may be a single layer, multiple layers, or a composite layer. The first insulating layer is referred to as a buffer layer for improving the water and oxygen resistance of the base substrate, the second and the third insulating layers are referred to as gate insulating (GI) layers, the fourth insulating layer is referred to as an interlayer insulating (ILD) layer, and the fifth insulating layer is referred to as a passivation (PVX) layer. The semiconductor layer may be made of a material, such as an amorphous indium gallium zinc oxide material (a-IGZO), zinc oxynitride (ZnON), indium zinc tin oxide (IZTO), amorphous silicon (a-Si), polycrystalline silicon (p-Si), sexithiophene and polythiophene, that is, the present disclosure is applicable to transistors manufactured based on oxide technology, silicon technology and organic technology.

In an exemplary embodiment, the thickness of the first insulating layer is 3000 angstroms to 5000 angstroms, the thickness of the second insulating layer is 1000 angstroms to 2000 angstroms, the thickness of the third insulating layer is 4500 angstroms to 7000 angstroms, the thickness of the fourth insulating layer is 3000 angstroms to 5000 angstroms, and the thickness of the fifth insulating layer is 3000 angstroms to 5000 angstroms.

High-resolution (PPI) display has finer picture quality and display quality, and has become a design trend. Since the pixel area of high-resolution display is relatively small, various interference factors, especially the influence of the data signal line on the critical node in the pixel driving circuit, need to be considered for arranging the pixel driving circuit in a limited space. In the pixel driving circuit shown in FIG. 4, the data voltage Vdt provided by the data signal line is written into the second node N2 through the first transistor T1, and is coupled to the first node N1 through the threshold capacitor CVth, thereby controlling a potential of the gate electrode of the third transistor T3 (driving transistor) to implement display under different data voltages Vdt. As shown in FIG. 6 and in conjunction with FIGS. 7 to 13, the data signal lines of three sub-pixels in a sub-pixel row will form parasitic capacitance together with the first node N1 (the storage capacitor first polar plate and the threshold capacitor first polar plate) of the present sub-pixel or an adjacent sub-pixel. Since the data voltage Vdt is written row by row at different time and the data signal for each sub-pixel column is refreshed row by row, for the pixel driving circuit in the nth sub-pixel column, jumps of the data voltage Vdt in the n−1th sub-pixel column or the n+1th sub-pixel column will affect the potential of the first node N1 of the pixel driving circuit in the nth sub-pixel column through parasitic effects, thereby affecting a driving current flowing through the third transistor T3. In order to reduce the influence of jumps of the data voltage on the potential of the first node N1, a solution of increasing a distance between the data signal line and the first node N1 is used for a display substrate, but this solution is conducive to neither the layout nor improvement of resolution.

In an exemplary embodiment of the present disclosure, a first electrode is provided, the first electrode is arranged in the first conducting layer, there is an overlapping area between the orthographic projection of the first electrode on the base substrate and the orthographic projection of the data signal line on the base substrate, and the first electrode is connected to the second power line, which reduces the parasitic capacitance formed by the data signal line and the first node N1 of the present sub-pixel or an adjacent sub-pixel, effectively avoids the influence of jumps of the data voltage Vdt on the first node N1, and prevents the jumps of the data voltage Vdt from affecting the potential of the first node N1 of the pixel driving circuit, thereby avoiding the influence on the driving current flowing through the third transistor T3, and improving the display effect.

In an exemplary embodiment, the storage capacitor first polar plate, the threshold capacitor first polar plate (the first node N1) and the first electrode are all arranged in the first conducting layer, and the data signal line is arranged in the fourth conducting layer. Since the second conducting layer is arranged between the first conducting layer and the fourth conducting layer, the storage capacitor second polar plate and the threshold capacitor second polar plate in the second conducting layer may shield an electric field between the surface of one side of the storage capacitor first polar plate and the threshold capacitor first polar plate facing the fourth conducting layer and the data signal line. Since the first electrode is provided on the first conducting layer, and there is an overlapping area between the orthographic projection of the first electrode on the base substrate and the orthographic projection of the data signal line on the base substrate, the first electrode may shield an electric field between the surface of one side of the storage capacitor first polar plate and the threshold capacitor first polar plate away from the fourth conducting layer and the data signal line.

As can be seen from the structure and manufacturing process of the display substrate described above, in the display substrate in accordance with an exemplary embodiment of the present disclosure, by arranging the first electrode on the first conducting layer, the first electrode reduces the parasitic capacitance formed by the data signal line and the first node N1 of the present sub-pixel or an adjacent sub-pixel and effectively avoids the influence of jumps of the data voltage Vdt on the first node N1, thereby improving the display effect. Although there is parasitic capacitance between the first electrode and the data signal line, the parasitic capacitance substantially has no influence on the performance of the pixel driving circuit because the first electrode is connected to the second power line. Since the first electrode provided in an exemplary embodiment of the present disclosure shields the influence of the jumps of the data voltage Vdt on the first nodes N1, the distance between the data signal line and the storage capacitor and threshold capacitor may be reduced effectively, which not only is conducive to the layout, but also can reduce the pixel area and is therefore conducive to improving the resolution of the display substrate. The manufacturing process of the display substrate in accordance with an exemplary embodiment of the present disclosure may be compatible well with an existing manufacturing process, with simple process implementation, is easy to carry out, and has high production efficiency, a low production cost and a high yield.

The structure and the manufacturing process thereof shown in the present disclosure are illustrated exemplarily only. In an exemplary implementation, the first electrode may be arranged in the second conducting layer or the third conducting layer. For example, the first electrode may be arranged in the second conducting layer, and may be arranged in the same layer as the storage capacitor second polar plate and the threshold capacitor second polar plate, the first electrode, and the storage capacitor second polar plate and the threshold capacitor second polar plate may be formed simultaneously through a single patterning process, and the shape of the first electrode may be the same as the shape described in the aforementioned exemplary embodiments. Since the storage capacitor first polar plate and the threshold capacitor first polar plate are arranged in the first conducting layer and the data signal line is arranged in the fourth conducting layer, the first electrode is arranged between the threshold capacitor first polar plate and the data signal line, and the first electrode may not only shield the electric field between the surface of one side of the threshold capacitor first polar plate facing the fourth conducting layer and the data signal line, but also shield the electric field between the surface of one side of the threshold capacitor first polar plate away from the fourth conducting layer and the data signal line. As another example, the first electrode may be arranged in the third conducting layer, and may be arranged in the same layer as the first power line and the reference signal line, the first electrode, and the first power line and the reference signal line may be formed simultaneously through a single patterning process, and the shape of the first electrode may be the same as the shape of the second electrode segment in the aforementioned exemplary embodiments. Since the storage capacitor first polar plate and the threshold capacitor first polar plate are arranged in the first conducting layer and the data signal line is arranged in the fourth conducting layer, the first electrode is arranged between the threshold capacitor first polar plate and the data signal line, and the first electrode may not only shield the electric field between the surface of one side of the threshold capacitor first polar plate facing the fourth conducting layer and the data signal line, but also shield the electric field between the surface of one side of the threshold capacitor first polar plate away from the fourth conducting layer and the data signal line. For the case that the first electrode is arranged in the second conducting layer or the third conducting layer, the structure of the connecting electrode in the corresponding conducting layer may be altered according to actual needs, which is not limited herein in the present disclosure.

In an exemplary implementation, the display substrate of the present disclosure may be applied to a display apparatus with a pixel driving circuit, such as an OLED, a quantum dot display (QLED), a light emitting diode display (Micro LED or Mini LED) or a quantum dot light emitting diode display (QDLED), which is not limited herein in the present disclosure.

An exemplary embodiment of the present disclosure provides a method for manufacturing a display substrate, so as to manufacture the display substrate in accordance with the exemplary embodiment described above. In an exemplary embodiment, the display substrate includes a base substrate, a second power line, a data signal line and a plurality of sub-pixels, wherein at least one sub-pixel includes a pixel driving circuit and a light emitting device connected to the pixel driving circuit, the pixel driving circuit is connected respectively to the data signal line and the light emitting device is connected to the second power line; and the method includes:

forming a semiconductor layer and a plurality of conducting layers, which are arranged at one side of the semiconductor layer away from the base substrate, on the base substrate, wherein a first electrode is arranged in at least one conducting layer, the first electrode is connected to the second power line, and there is an overlapping area between an orthographic projection of the first electrode on the base substrate and an orthographic projection of the data signal line on the base substrate.

In an exemplary embodiment, the forming a semiconductor layer and a plurality of conducting layers, which are arranged at one side of the semiconductor layer away from the base substrate, on the base substrate may include:

forming a semiconductor layer on the base substrate; and forming sequentially a first conducting layer, a second conducting layer, a third conducting layer and a fourth conducting layer on the semiconductor layer, wherein the first electrode is arranged in the first conducting layer, the second conducting layer or the third conducting layer, the second power line and the data signal line are arranged in the fourth conducting layer, and the second power line is connected to the first electrode through a via hole.

The manufacturing process in the method for manufacturing the display substrate of an exemplary embodiment of the present disclosure is described in detail in the foregoing exemplary embodiments, and will not be repeated herein.

The present disclosure further provides a display apparatus which includes the aforementioned display substrate. The display apparatus may be any product or component with a display function, such as a mobile phone, a tablet computer, a television, a display, a notebook computer, a digital photo frame, or a navigator, and the embodiments of the present invention are not limited thereto.

Although the implementations disclosed in the present disclosure are described as above, the described contents are only implementations which are used in order to facilitate understanding of the present disclosure, and are not intended to limit the present invention. Any skilled person in the art to which the present disclosure pertains may make any modifications and alterations in forms and details of implementation without departing from the spirit and scope of the present disclosure. However, the patent protection scope of the present invention should be subject to the scope defined by the appended claims.

The invention claimed is:

1. A display substrate, comprising a base substrate, a second power line, a data signal line and a plurality of sub-pixels, wherein at least one sub-pixel comprises a pixel driving circuit and a light emitting device connected to the pixel driving circuit, wherein the pixel driving circuit at least comprises a first transistor, a second transistor, a third transistor, a fourth transistor and a fifth transistor;

wherein a first pole of the first transistor is connected to the data signal line, and a second pole of the first transistor is connected to a second node; a first pole of the second transistor is connected to a first node, and a second pole of the second transistor is connected to a third node; a gate electrode of the third transistor is connected to the first node to control a driving current flowing through the third transistor; a first pole of the fourth transistor is connected to an initial signal line; and a first pole of the fifth transistor is connected to a reference signal line, and a second pole of the fifth transistor is connected to the second node;

wherein the pixel driving circuit further comprises a threshold capacitor comprising a threshold capacitor first polar plate and a threshold capacitor second polar plate; and the threshold capacitor second polar plate is connected to the second node, and the threshold capacitor first polar plate is connected to the first node; wherein the second pole of the fifth transistor is connected to the threshold capacitor second polar plate via a fourth connection electrode;

wherein a semiconductor layer and a plurality of conducting layers, which are arranged at one side of the semiconductor layer away from the base substrate, are arranged on the base substrate, a first electrode is arranged in at least one conducting layer, the first electrode is connected to the second power line, and there is an overlapping area between an orthographic projection of the first electrode on the base substrate and an orthographic projection of the data signal line on the base substrate;

wherein the second pole of the first transistor is electri-
cally connected to the threshold capacitor second polar
plate through the fourth connection electrode;
wherein an orthographic projection of the fourth connec-
tion electrode on the base substrate overlaps with an
orthographic projection of the second power line on the
base substrate.

2. The display substrate according to claim 1, wherein
the first electrode comprises a first electrode segment
extending along a first direction and a second electrode
segment extending along a second direction,
there is an overlapping area between an orthographic
projection of the second electrode segment on the base
substrate and the orthographic projection of the data
signal line on the base substrate.

3. The display substrate according to claim 2, wherein the
second power line at least partially extends along the second
direction and the reference signal line at least partially
extends along the second direction.

4. The display substrate according to claim 3, wherein the
orthographic projection of the data signal line on the base
substrate is located between an orthographic projection of
the reference signal line on the base substrate and an
orthographic projection of the second power line on the base
substrate.

5. The display substrate according to claim 2, wherein the
reference signal line at least partially extends along the
second direction, and there is an overlapping area between
an orthographic projection of the reference signal line on the
base substrate and an orthographic projection of the first
electrode on the base substrate.

6. The display substrate according to claim 1, wherein
the plurality of conducting layers comprise a first con-
ducting layer, a second conducting layer, a third con-
ducting layer and a fourth conducting layer arranged
sequentially at one side of the semiconductor layer
away from the base substrate,
the data signal line is arranged in the fourth conducing
layer, and
the first electrode is arranged in the first conducting layer,
the second conducting layer or the third conducting
layer.

7. The display substrate according to claim 6, wherein the
second power line is arranged in the fourth conducting layer,
and the second power line is connected to the first electrode
through a via hole.

8. The display substrate according to claim 6, wherein
the first electrode is arranged in the first conducting layer
or the second conducting layer,
an interlayer connecting electrode is also arranged in the
third conducting layer,
the interlayer connecting electrode is connected to the first
electrode through a via hole, and
the second power line is connected to the interlayer
connecting electrode through a via hole.

9. The display substrate according to claim 6, wherein
the fourth transistor is a double-gate transistor, and at least
comprises a fourth active layer arranged in the semi-
conductor layer and two fourth gate electrodes; and
the display substrate further comprises a first sub-polar
plate, and there is an overlapping area between an
orthographic projection of the first sub-polar plate on
the base substrate and an orthographic projection of the
fourth active layer, located between the two fourth gate electrodes, on the base substrate; wherein the two
fourth gate electrodes are arranged in the first conduct-
ing layer, the first sub-polar plate is arranged in the
second conducting layer.

10. The display substrate according to claim 6, wherein
the fifth transistor is a double-gate transistor, and at least
comprises a fifth active layer arranged in the semicon-
ductor layer and two fifth gate electrodes; and
the display substrate further comprises a second sub-polar
plate, and there is an overlapping area between an
orthographic projection of the second sub-polar plate
on the base substrate and an orthographic projection of
the fifth active layer, located between the two fifth gate
electrodes, on the base substrate; wherein the two fifth
gate electrodes are arranged in the first conducting
layer, the second sub-polar plate is arranged in the
second conducting layer.

11. The display substrate according to claim 10, wherein
the first transistor is a double-gate transistor, and at least
comprises a first active layer arranged in the semicon-
ductor layer and two first gate electrodes; and
the display substrate further comprises a third sub-polar
plate, and there is an overlapping area between an
orthographic projection of the third sub-polar plate on
the base substrate and an orthographic projection of the
first active layer, located between the two first gate
electrodes, on the base substrate; wherein the two first
gate electrodes are arranged in the first conducting
layer, the third sub-polar plate is arranged in the second
conducting layer.

12. The display substrate according to claim 11, wherein
the second sub-polar plate and the third sub-polar plate are
electrically connected.

13. The display substrate according to claim 11, wherein
the second transistor is a double-gate transistor, and at
least comprises a second active layer arranged in the
semiconductor layer and two second gate electrodes;
and
the display substrate further comprises a fourth sub-polar
plate, and there is an overlapping area between an
orthographic projection of the fourth sub-polar plate on
the base substrate and an orthographic projection of the
second active layer, located between the two second
gate electrodes, on the base substrate; wherein the two
second gate electrodes are arranged in the first con-
ducting layer, the third sub-polar plate is arranged in the
second conducting layer.

14. The display substrate according to claim 1, wherein
the second electrode of the fourth transistor is electrically
connected to the threshold capacitor first polar plate through
a second connection electrode.

15. The display substrate according to claim 14, wherein
an orthographic projection of the second connection elec-
trode on the base substrate overlaps with an orthographic
projection of the second power line on the base substrate.

16. The display substrate according to claim 1, wherein an
orthographic projection of the first transistor on the base
substrate and an orthographic projection of the fifth transis-
tor on the base substrate are located on a same side of an
orthographic projection of the threshold capacitor on the
base substrate.

17. A display apparatus comprising the display substrate
according to claim 1.

* * * * *